(12) United States Patent
Held

(10) Patent No.: US 9,872,417 B2
(45) Date of Patent: Jan. 16, 2018

(54) ELECTRONICS COOLING SYSTEM AND CORRESPONDING DEVICES AND METHODS

(71) Applicant: ARRIS Enterprises, Inc., Suwanee, GA (US)

(72) Inventor: Joshua Held, Los Gatos, CA (US)

(73) Assignee: ARRIS Enterprises LLC, Suwanee, GA (US)

(*) Notice: Subject to any disclaimer, the term of this patent is extended or adjusted under 35 U.S.C. 154(b) by 8 days.

(21) Appl. No.: 14/939,244

(22) Filed: Nov. 12, 2015

(65) Prior Publication Data

US 2017/0027085 A1  Jan. 26, 2017

Related U.S. Application Data

(60) Provisional application No. 62/194,977, filed on Jul. 21, 2015.

(51) Int. Cl.
*H05K 7/20* (2006.01)

(52) U.S. Cl.
CPC ..... *H05K 7/20727* (2013.01); *H05K 7/20145* (2013.01); *H05K 7/20172* (2013.01)

(58) Field of Classification Search
CPC .......... H05K 7/20563; H05K 7/20727; H05K 7/20136; H05K 7/20145; H05K 7/20172; H05K 7/20181; H05K 7/20554; H05K 7/20718; G06F 1/20; G06F 1/203
USPC .............. 361/695, 679.48–679.51; 454/184; 312/236
See application file for complete search history.

(56) References Cited

U.S. PATENT DOCUMENTS

| 6,675,976 | B2* | 1/2004 | Steinman | H04Q 1/10 211/26 |
| 7,050,301 | B2* | 5/2006 | Wong | H05K 7/20909 165/122 |
| 7,751,189 | B2* | 7/2010 | Ahuja | G06F 1/20 165/104.34 |
| 8,385,064 | B1* | 2/2013 | Smith | H05K 7/20727 361/679.48 |
| 8,885,341 | B2 | 11/2014 | Desmarets | |
| 2004/0032716 | A1* | 2/2004 | Roan | G06F 1/18 361/679.48 |
| 2010/0091458 | A1 | 4/2010 | Mosier, Jr. et al. | |
| 2012/0033379 | A1* | 2/2012 | Lam | H05K 7/20145 361/695 |

(Continued)

*Primary Examiner* — Zachary M Pape
(74) *Attorney, Agent, or Firm* — Lori Anne D. Swanson

(57) ABSTRACT

An electronics cooling system includes a housing (101) defining four quadrants (110,111,112,113) with a front face (102) defining an air inlet (301) in the first quadrant and a rear face (203) defining an air exhaust (401) in the second quadrant. A first plenum (701) is disposed adjacent to the air inlet, while a second plenum (702) is disposed adjacent to the air exhaust. A first circuit card corridor (703) and a second circuit card corridor (704), separated by a barrier wall (705), are disposed between the first plenum and the second plenum. A first fan module (304) is disposed adjacent to the first circuit card corridor. A second fan module (404) is disposed adjacent to the second circuit card corridor. The structure defines a first cooling path to a first side of the barrier wall and a second cooling path to a second side of the barrier wall.

18 Claims, 16 Drawing Sheets

(56) References Cited

U.S. PATENT DOCUMENTS

2015/0105271 A1* 4/2015 Floratos .............. C12Q 1/6883
506/2

* cited by examiner

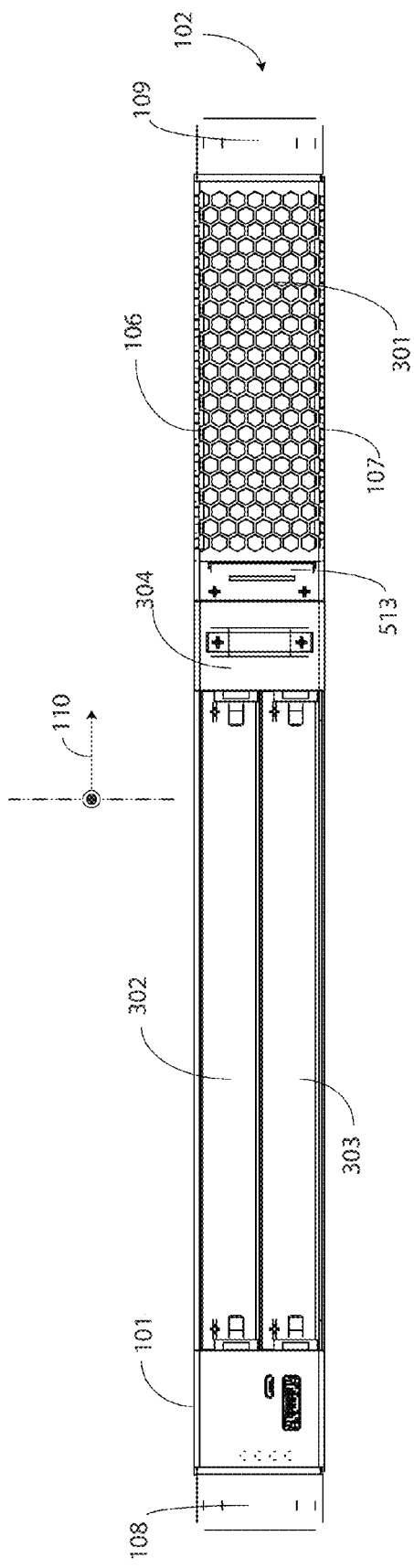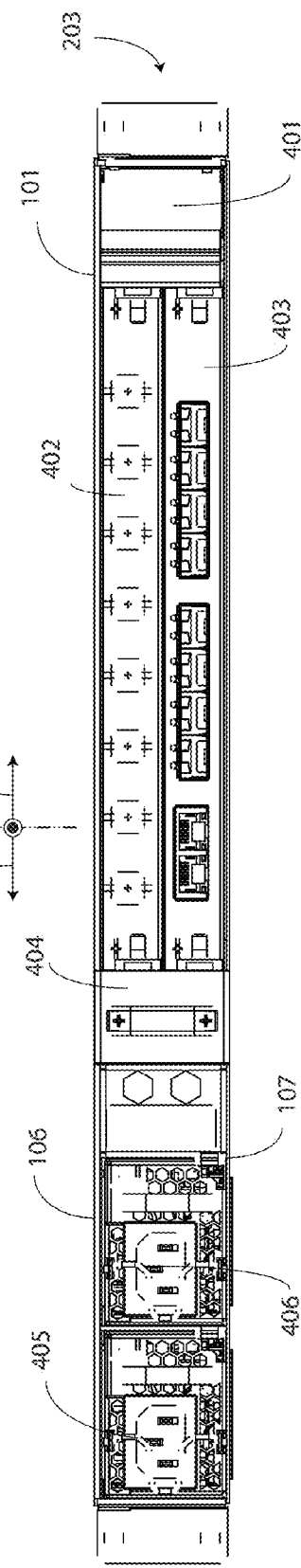
FIG. 3
FIG. 4

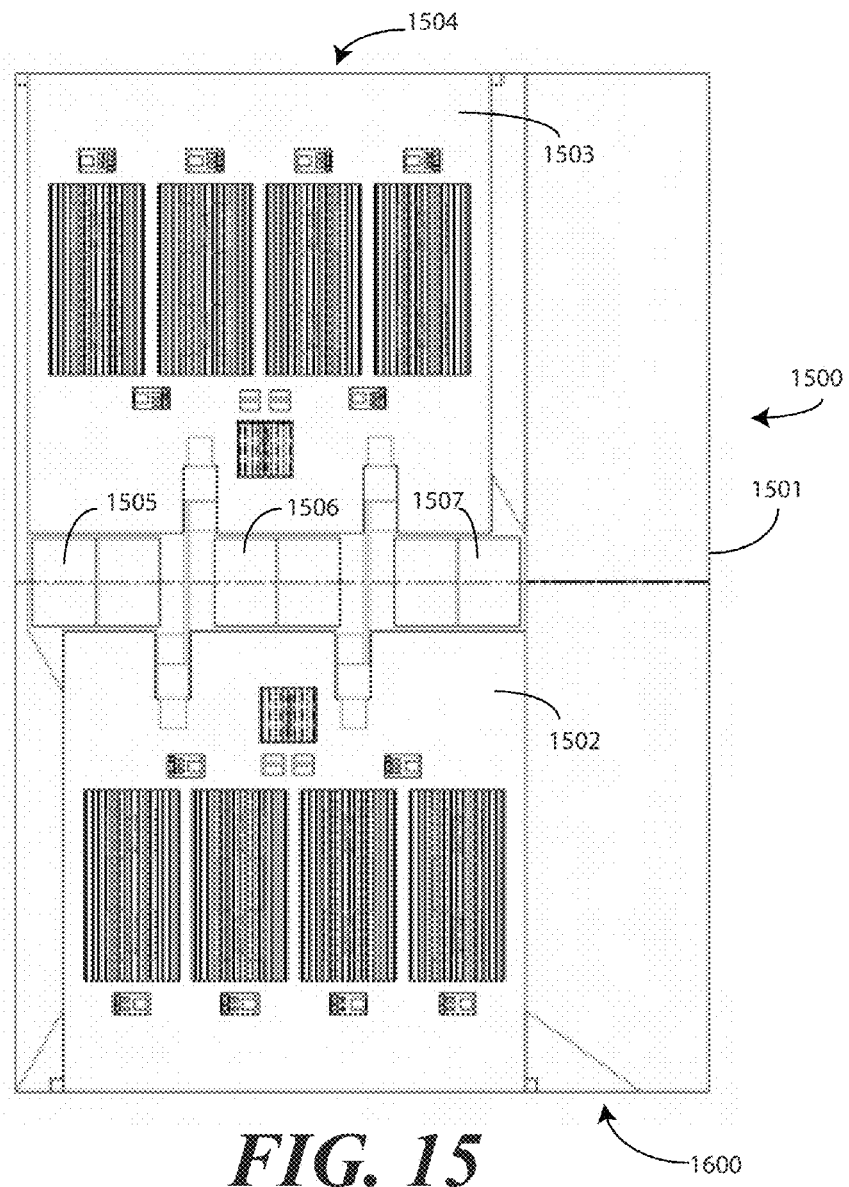
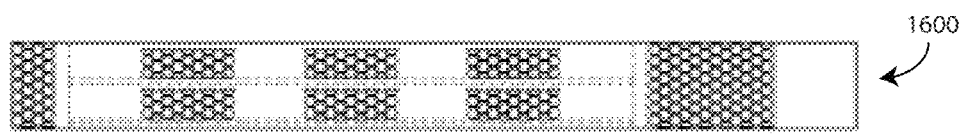
FIG. 15
FIG. 16

ELECTRONICS COOLING SYSTEM AND CORRESPONDING DEVICES AND METHODS

CROSS REFERENCE TO PRIOR APPLICATIONS

This application claims priority and benefit under 35 U.S.C. §119(e) from U.S. Provisional Application No. 62/194,977, filed Jul. 21, 2015, which is incorporated by reference for all purposes.

BACKGROUND

Technical Field

This disclosure relates generally to electronics systems, and more particularly to electronics cooling systems.

BACKGROUND ART

Microprocessors and other integrated circuits are increasingly becoming more advanced. As the processing power of these devices continues to increase, manufacturers continue to find ways to make the physical size of these devices smaller and smaller. Devices with increasingly powerful computational power continue to get smaller and smaller.

While these technological advances yield smaller devices with more computational capabilities, such advances come with tradeoffs. A primary tradeoff is the fact that these smaller devices produce large amounts of heat, which must be removed for the devices to operate properly. This issue of excess heat generation is exacerbated when large numbers if integrated circuits and processors are densely populated in computer and server housings.

Illustrating by example, in server systems and other advanced computing platforms, large numbers of processors, memory devices, drivers, and other circuit components may be populated on printed circuit boards disposed within a chassis. When these components are all working simultaneously, they generate tremendous amounts of heat. This heat must be removed from the chassis to prevent the circuit components from overheating. Fans are traditionally used in chassis-based systems to remove heat so that electrical components within the chassis can function properly.

While fans are effective at removing heat, they frequently suffer from wear due to continual or intermittent operation. Due to this mechanical wear, many manufacturers recommend that fans be replaced after a predetermined amount of use. When replacement is required, most devices must be taken "off-line" or out of service. This results in device and system downtime that is undesirable.

The same is true for the electrical components operating within a chassis. They frequently need to be replaced to upgrade, reconfigure, repair, or otherwise change the operating configuration of an electronic device. As with fan maintenance, a device generally must be taken off-line to swap or reconfigure the electrical components.

It would be advantageous to have an improved electronic device that allowed in-field electronic component and fan assembly replacement, but that still provided adequate cooling for the electronic components operating within the device.

BRIEF DESCRIPTION OF THE DRAWINGS

FIG. 3 illustrates a front elevation view of one explanatory electronic device employing a cooling system in accordance with one or more embodiments of the disclosure.

FIG. 4 illustrates a rear elevation view of one explanatory electronic device employing a cooling system in accordance with one or more embodiments of the disclosure.

FIG. 15 illustrates yet another explanatory electronic device employing yet another cooling system in accordance with one or more embodiments of the disclosure.

FIG. 16 illustrates a front plan view of the electronic device of FIG. 15.

Figure 1:
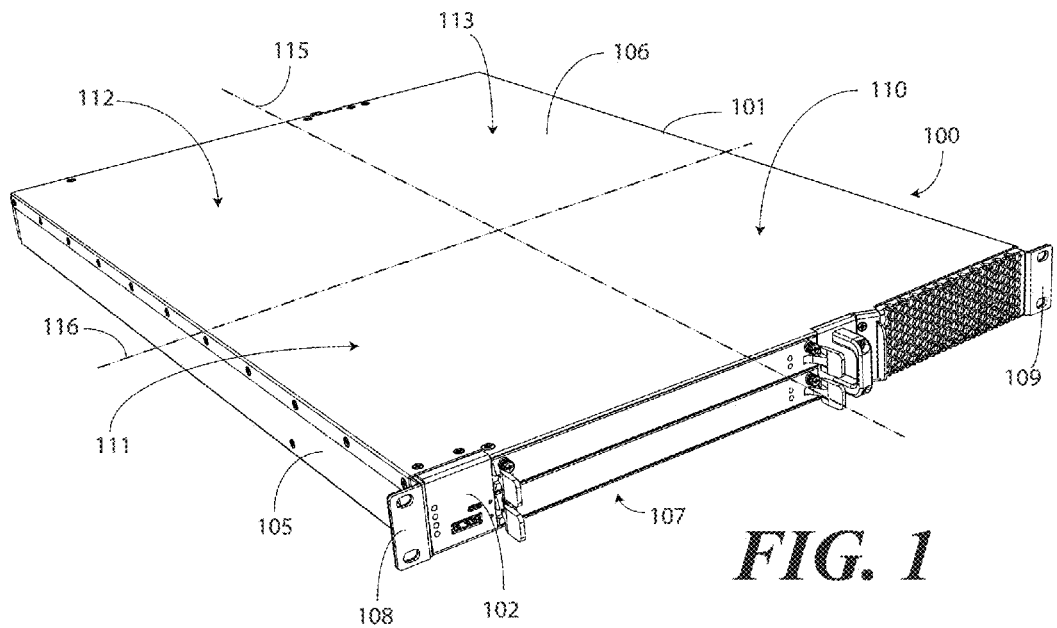
FIG. 1 illustrates a perspective view of one explanatory electronic device employing a cooling system in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. The term "substantially" is used to refer to alignments, measurements, dimensions, or other metrics inclusive of manufacturing tolerances. Accordingly, a "substantially orthogonal angle" with manufacturing tolerances of plus or minus two degrees would include angles between 88 and 92 degrees, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide an electronics cooling system that allows for fan modules, power supplies, and other components to be "hot-swappable," i.e., replaced while the corresponding computer equipment or electronic device remains operational. Additionally, fan modules, power supplies, and filters can be hot-swapped without requiring any specialized tools or specialized training. At the same time, embodiments of the disclosure provide a cooling system that ensures proper cooling despite the fact that allowing fan modules to be hot-swappable in a rack mount environment precludes traditional "front-to-back" cooling where air enters the front of a device housing, is drawn in a straight line by fans through the housing, and is exhaust from the rear of the housing. Moreover, the ability to insert circuit cards into the front and rear faces of the housing allows the circuit cards to be "field replaceable," i.e., they can be replaced in the field without having to send the electronic device to a repair center. In many cases, the circuit cards can be field replaced in only a few seconds, effectively making them nearly hot-swappable.

Figure 9:
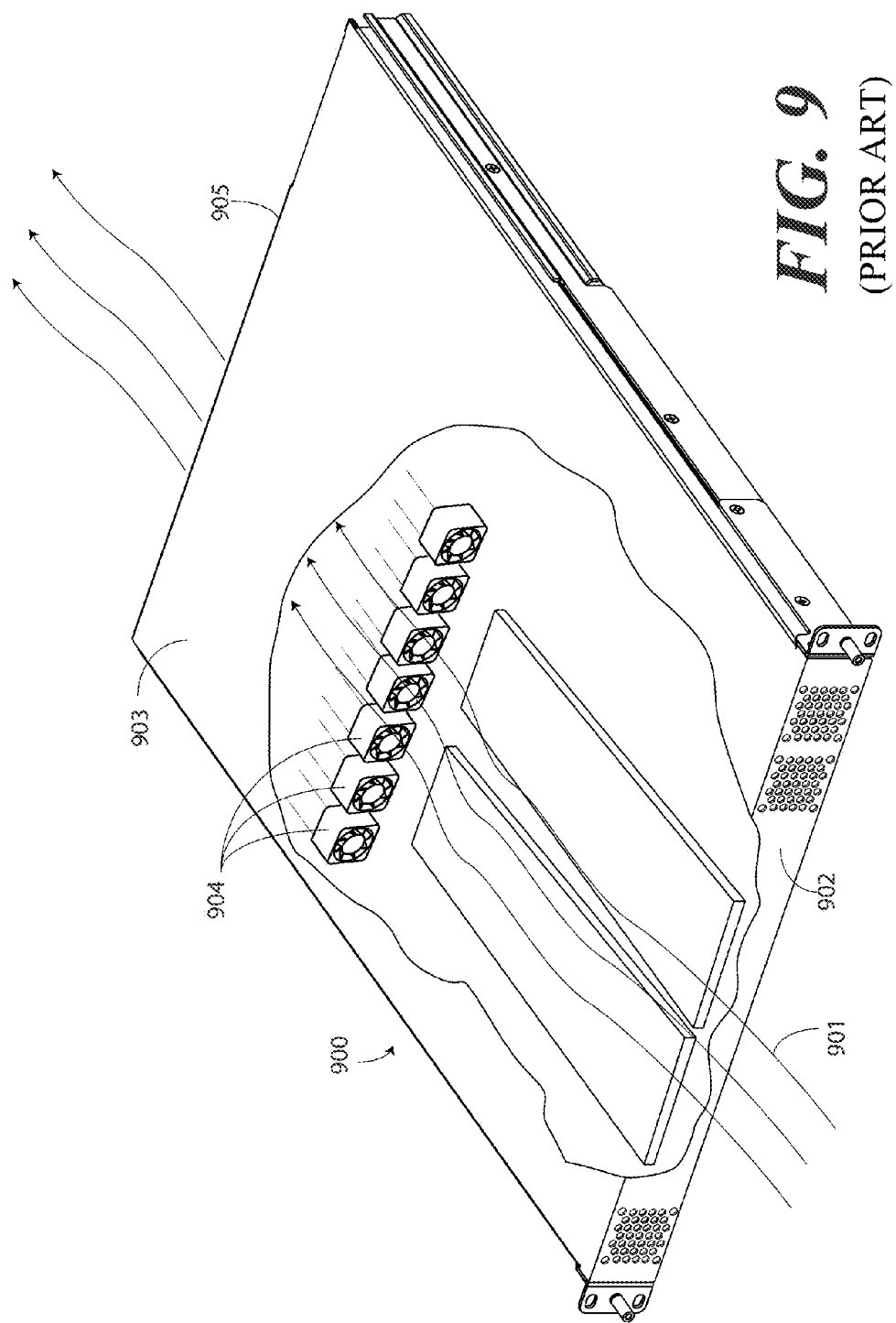
FIG. 9 illustrates one prior art electronic device.

Turning briefly to FIG. 9, illustrated therein is one example of such a prior art device 900. As shown, air 901 flows into the front face 902 of the chassis 903 and is drawn by fan assemblies 904 oriented parallel with the front face 902 of the chassis in a straight line. The air 901 then exhausts through the rear face 905 of the chassis 903.

Embodiments of the present disclosure differ from the prior art device 900 of FIG. 9. The prior art device 900 of FIG. 9 is designed with front to back cooling. Air 901 is drawn into the front face 902 of the chassis 903 by fan assemblies 904. The fan assemblies 904 can be placed in the front, middle, or back of the chassis 903. In this embodiment, the fan assemblies 904 are placed in the middle of the chassis 903. The air 901 is forced over the internal components. Heated air is then exhaust through the rear face 905.

The front face 902 and the rear face 905 of the chassis 903 generally require very large perforation patterns to allow adequate airflow through the chassis 903. These required perforation patterns limit the amount of space for necessary items such as connectors, which are needed to process video signal into and out of the chassis 903 to adjacent headend equipment. There are several disadvantages to this chassis design.

First and foremost, as air 901 flows though the chassis 903, the temperature of the air can radically increase causing the rear components to be far hotter than the components located toward the front of the chassis 903. This behavior tends to significantly limit the maximum ambient temperature the chassis 903 can tolerate.

Second, the fan assemblies 904 are not hot swappable. In many instances, they are not even field serviceable. In the event of fan failure, this particular prior art device 900 would have to be removed from the equipment racks and returned to the manufacturer for repair. Similarly, if non-serviceable boards located at the back had a failure the unit would also have to be returned to the manufacturer for repair.

Third, the prior art device 900 includes very restricted cooling paths that significantly reduce overall system cooling flow and overall thermal performance. This is true because restrictive air cutouts are present in the front face 902 and the rear face 905. Additionally, there are restrictions across the circuit boards and restrictions through the midplane (where present). Fourth, as noted above, the requirement for perforation patterns in the faceplates of front face 902 and the rear face 905 provide very limited space for optical and electrical connections.

In contrast to this prior art device 900, embodiments of the disclosure provide a new type of 1RU chassis that addresses each of the aforementioned deficiencies. With embodiments of the disclosure, a short path occurs across circuit cards, thereby reducing relative air temperature rise in the chassis. This provides the overall cooling system the ability to sustain very high ambient inlet temperatures. Additionally, the fan modules of embodiments of the disclosure are arranged longitudinally in the system, thereby accommodating more fans due to the great length of the system. This also increases the overall cooling capacity of the chassis. The hot swappable fan modules also allow users to completely replace fan trays very quickly, e.g., within fifteen seconds, without affecting the functionality of the unit.

Turning back to embodiments of the present disclosure, in one embodiment, an electronics cooling system comprises a housing that includes a front face, a rear face, and one or more sidewalls. The housing can be segmented into four quadrants, with a first quadrant disposed between the front face and a first sidewall, and a second quadrant disposed between the rear face and a second sidewall. This results in the first quadrant and the second quadrant being 180-degrees out of phase relative to each other. Illustrating by example, if the first quadrant is in the "southeast" corner of the housing, or at "about 4:30" when the housing is viewed in the top plan view, the second quadrant might be in the "northwest" corner, or at "about 10:30" in the top plan view.

In one or more embodiments, the first face defines an air inlet. In one embodiment, the air inlet is disposed within the first quadrant of the housing. Similarly, in one or more embodiments, the rear face defines an air exhaust. In one embodiment, the air exhaust is disposed in the second quadrant.

A first plenum is disposed adjacent to the air inlet. In one embodiment, the first plenum is defined by a first volume and a second volume, with the second volume being adjacent to the rear face and the first volume being adjacent to the front face. In one embodiment, the first volume is larger than the second volume. In one embodiment, the first plenum is defined by a volume having an L-shape, with one or more power supplies disposed in a complementary configuration with the L-shape between a base portion of the L-shape and an upper portion of the L-shape.

In one or more embodiments, one or more circuit cards are insertable into the housing. So as to be hot-swappable, in one embodiment a first set of circuit cards can be inserted through the front face, while a second set of circuit cards can be inserted through the rear face. When inserted into the housing, these circuit cards can be arranged horizontally so as to define a first circuit card corridor and a second circuit card corridor. In one embodiment, the first circuit card corridor and the second circuit card corridor are separated by a barrier wall. In one embodiment, the first circuit card corridor and the second circuit card corridor are disposed between the first plenum and the second plenum.

In one or more embodiments, one or more fan modules are insertable into the housing. Each fan module can comprise an array of fans. For example, in one embodiment a fan module includes six fan modules manufactured together as a single assembly that can be hot-swapped in an electronic device. If one or more fans fail, a technician can simply remove the bank of fans defining the fan module and replace it with a new fan module. This saves time and is less expensive than having to open a chassis, determine which fan failed, replace that individual fan, and close the chassis.

As with the circuit cards, so as to be hot swappable, in one embodiment a first fan module can be inserted into the housing through the front face, while a second fan module can be inserted into the housing through the rear face. When inserted into the housing, the first fan module extends into the housing from the front face to the barrier wall in one embodiment, and is disposed between the first plenum and the first circuit card corridor. Similarly, the second fan module extends into the housing from the rear face to the barrier wall in one embodiment, and is disposed between the first plenum and the second circuit card corridor. The first circuit card corridor defines a first cooling path to a first side of the barrier wall in such a configuration, while the second circuit card corridor defines a second cooling path to a second side of the barrier wall.

In one embodiment, air travels the first cooling path and the second path by making two directional changes through the housing. Illustrating by example, in one embodiment the first fan module and the second fan module are each operable to draw air into the housing through the air inlet along a first direction. Since the fans are oriented substantially orthogonally relative to the front face and the second face, the fan modules then draw air across the first circuit card corridor and the second circuit card corridor, respectively, in a second direction that is different from the first direction. In one embodiment, one or more baffles are disposed within the second plenum to, in conjunction with the fan modules, direct air from the one or more fan modules to the air exhaust. In one embodiment these baffles redirect air out of the housing through the air exhaust in a third direction different from the second direction. In one embodiment, the second direction is substantially orthogonal to both the first direction and the third direction.

Advantageously, embodiments of the disclosure provide a new housing that facilitates the replacement of four modular processing circuit cards that are replaceable through the front face and the rear face, respectively. Additionally, the fan modules are also hot swappable through the front face and the rear face, respectively. In one or more embodiments, the housing also includes two fully redundant power supplies. By making the housing modular, i.e., by allowing circuit cards, fans, or power supplies to be swapped without taking the device off-line, repairs and product enhancements can be performed by simply installing a new circuit card or new fan into the housing while it is still operational. Hot-swappable fan modules allow technicians to repair "worn out" cooling components without interrupting system operation. The inclusion of hot-swappable fan modules and circuit cards advantageously increase the reliability and usable life span of the electronic device.

While some embodiments of the disclosure below provide a "side to side" cooling system where air enters one of the right side or the left side and exists another of the right side or the left side, embodiments of the disclosure contemplate that many cooling rooms for electronic devices are traditionally configured to accommodate front to back cooling systems. Embodiments of the disclosure contemplate that this is the case because designers of telecommunication headends design the air conditioning of cooling rooms to efficiently remove heat when it is exhaust from the rear of chassis banks. The cooling rooms for such headends are typically designed with a "cold aisle," defined by where air conditioning enters the room, located at the front panel side of a chassis rack. Accordingly, a "hot aisle" defined by where the air conditioning return draws air from the room is located at a rear panel side of a chassis rack. Accordingly, embodiments of the disclosure contemplate that it can be desirable to have what appears, from the outside of the device, as front to back cooling because it allows headend operators to deploy devices configured in accordance with embodiments of the disclosure into existing headend cooling room infrastructure with minimal effort and maximum efficiency. At the same time, since air travels the first cooling path and the second path by making two directional changes through the housing in one embodiment, devices configured in accordance with one or more embodiments of the disclosure achieve optimal cooling while providing a completely modular chassis in which circuit cards, fan modules, filters, and power supplies can all be hot swapped into the device.

Embodiments of the disclosure provide an electronics cooling system that, in one embodiment, is configured as a 1RU chassis. Intake air enters at the front of the chassis and exhausts at the rear, with an internal transverse (horizontal. i.e., parallel to the front face and the rear face) redirection. This redirection causes the air to flow through a first circuit card corridor and a second circuit card corridor, respectively, across heat generating line circuit cards. In one or more embodiments, a fan module is positioned in a longitudinal orientation directly adjacent to the stacked line circuit cards in a 1RU chassis height. As will be shown in particular with reference to FIGS. 10 and 14 below, such an orientation can improve cooling over prior an chassis designs where the fan modules are positioned transverse, i.e., parallel with the front face and the rear face to draw air front to back, or longitudinally above the circuit cards. Moreover, and distinct from 2RU plus chassis, embodiments disclosed below are implementable in a 1RU chassis design. Accordingly, while embodiments of the disclosure can be implemented in 2RU chassis, the height of a 2RU or more chassis is not required to achieve optimal multi-directional cooling. Optimal cooling can be done in the thin interior of a 1RU chassis.

Embodiments of the disclosure provide techniques that allow side-to-side circuit card module cooling while still providing "front to back" cooling as seen from the exterior of the chassis. As noted above, the unique configurations provided by embodiments of the disclosure further allow for hot-swappable fan modules to be placed longitudinally into the front face or the rear face of the chassis. This provides two benefits: First, it provides more airflow and cooling across heat generating circuit cards. Second, it allows for simple and easy servicing because the chassis need not be taken from a rack or other mount to swap fan modules. The configuration additionally offers full use of processing module faceplate real estate for input/output connectors. Multi-directional internal airflow paths through the first circuit card corridor and the second circuit card corridor in accordance with embodiments of the disclosure has been demonstrated to be highly effective through extensive thermal modeling used when conceiving embodiments of the disclosure.

Embodiments of the disclosure provide the best and most optimal use of the "user accessible" sides, i.e., the front face and the rear face of a device housing or chassis, when that device housing or chassis is mounted in the standard nineteen inch equipment racks used with 1RU chassis dimensions. Accordingly, embodiments of the disclosure allow service personnel to fully service the device housing or chassis without removing it from the rack. The front face and the rear face of the chassis allow service personnel to remove and replace all circuit cards, fan modules, and power supplies while the device remains operational and fully coupled to the rack. Despite providing a front face and rear face with sufficient real estate to hot-swap these components, air intake and exhaust ports sufficiently provide volumes for cooling through the various plenums within the unit. The front and rear faces further offer sufficient surface area for the optical and electrical connections required to connect to adjacent headend equipment.

In one or more embodiments, a 1RU chassis includes two fully redundant power supplies. This allows for a hot-swap of one of the power supplies should it become defective. At the same time, the use of two narrow power supplies, each of which is placed at the rear of the chassis in an adjacent configuration, allows embodiments of the disclosure to employ a non-typical cooling path arrangement. In one or more embodiments, cool air enters the chassis through the air intake disposed along a first quadrant of the chassis on front housing. Dust is then collected by angled air filter. The air is then split between a first circuit card corridor and a second circuit card corridor by a first fan module and a second fan module, disposed at the front and rear of the chassis, respectively, working in conjunction with a barrier wall between the circuit card corridors and the housings of each of the rear mounted power supplies. The air thus flows across the circuit card corridors and makes an orthogonal turn to exhaust through narrow exhaust plenum. Cooling air for the power supplies passes straight though and exhausts at the rear of the unit in one or more embodiments.

As noted in the discussion above, the internal arrangement of embodiments of the disclosure allows for complete system modularity while the device housing or chassis is mounted in a rack. Arrangements include hot-swappable fan modules, circuit cards, and power supplies in a 1RU chassis front-to-back form factor. The use of extensive thermal modeling in refining embodiments of the disclosure, as well as the innovative use of materials, orientations, and geometries provides both a highly efficient cooling system and complete modularity, thereby providing long deployment of electronic devices configured in accordance with embodiments of the disclosure. Cooling paths within embodiments of the disclosure are optimized and precisely balanced to provide equal cooling to all portions of the modular circuit cards, while allowing for maximum faceplate real estate for optical and electrical connections to adjacent headend equipment.

Figure 2:
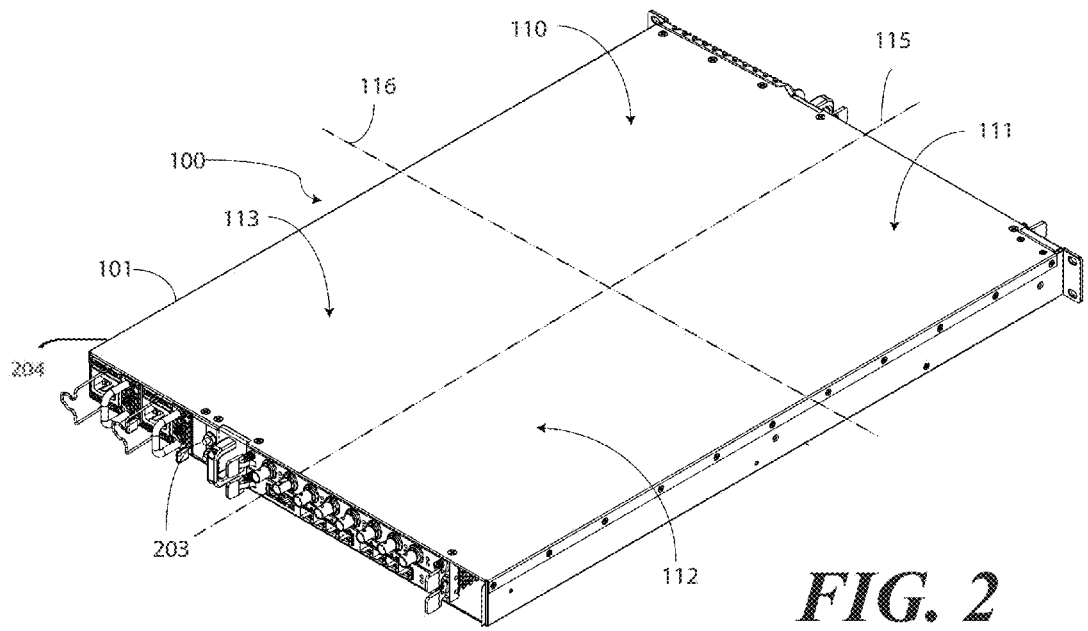
FIG. 2 illustrates another perspective view of one explanatory electronic device employing a cooling system in accordance with one or more embodiments of the disclosure.

Turning now to FIGS. 1 and 2, illustrated therein is one electronic device 100 employing an electronics cooling system in accordance with one or more embodiments of the disclosure. As shown in FIG. 1, the electronic device 100 includes a housing 101. In this illustrative embodiment, the housing 101 is configured as a 1RU chassis. The housing 101 includes a front face 102, a rear face 203, a first sidewall 204, a second sidewall 105, a top surface 106, and a bottom surface 107. In this illustrative embodiment, one or more rack mounts 108,109 are coupled to the housing 101 between the front face 102 and the first sidewall 204 and the second sidewall 105, respectively, so that the housing 101 can be coupled to a rack. In one embodiment, the housing 101 is configured to be coupled to a standard nineteen-inch equipment rack.

In one embodiment, the housing 101 defines four quadrants 110,111,112,113 defined by reference axes 115,116 running orthogonally with the front face 102 and the rear face, and the first sidewall 204 and the second sidewall 105, respectively. If one considers the four quadrants 110,111, 112,113 to be arranged in a clockwise order, a first quadrant 110 would be adjacent to a second quadrant 111, which is adjacent to a third quadrant 112, which is adjacent to a fourth quadrant 113, which is then adjacent to the first quadrant. Recall from above that relational terms such as first and second, top and bottom, and the like may be used solely to distinguish one entity or action from another entity or action without necessarily requiring or implying any actual such relationship or order between such entities or actions. Accordingly, quadrant 110 could be referred to as a first quadrant, while quadrant 112 is referred to as a second quadrant, and so forth.

In this illustrative embodiment, a first quadrant 110 is disposed between the front face 102 and the first sidewall 204. The third quadrant 112 is disposed between the rear face 203 and the second sidewall 105. This results in the first quadrant 110 and the third quadrant 112 being 180-degrees out of phase relative to each other. Said differently, if the first quadrant 110 is in the "southeast" corner of the housing 101, or at "about 4:30" when the housing 101 is viewed in the top plan view, the third quadrant 112 might be in the "northwest" corner of the housing 101, or at "about 10:30" in the top plan view.

Turning to FIGS. 3 and 4, illustrated therein are the front face 102 and the rear face 203 of the housing 101, respectively. In one or more embodiments, the front face 102 defines an air inlet 301. In one embodiment, the air inlet 301 is disposed within the first quadrant 110 of the housing 101. Similarly, in one or more embodiments, the rear face 203 defines an air exhaust 401. In one embodiment, the air exhaust 401 is disposed in the third quadrant 113 of the housing 101.

In one embodiment an angled air filter 513 can be inserted into the first plenum 701 to capture dust and other particulate. In one embodiment, the air filter 513 is inserted at an angle relative to the front face 102. For example, in one embodiment the air filter 513 is inserted at an angle of between 110 and 115 degrees relative to the front face 102. In one embodiment, the angle is 114 degrees.

In one embodiment, the grille spanning the air inlet 301 is slightly angled relative to the remainder of front face 102, extending outwardly from the front face 102 at the rack mount 109 to the air filter 513 by between one and five degrees. In one embodiment, the grille extends outwardly by about three degrees. The air filter 513 can be inserted into the housing 101 at an angle so that airflow entering the air inlet 301 can be redirected trough the filter to remove dust and other airborne particulate.

Figure 20:
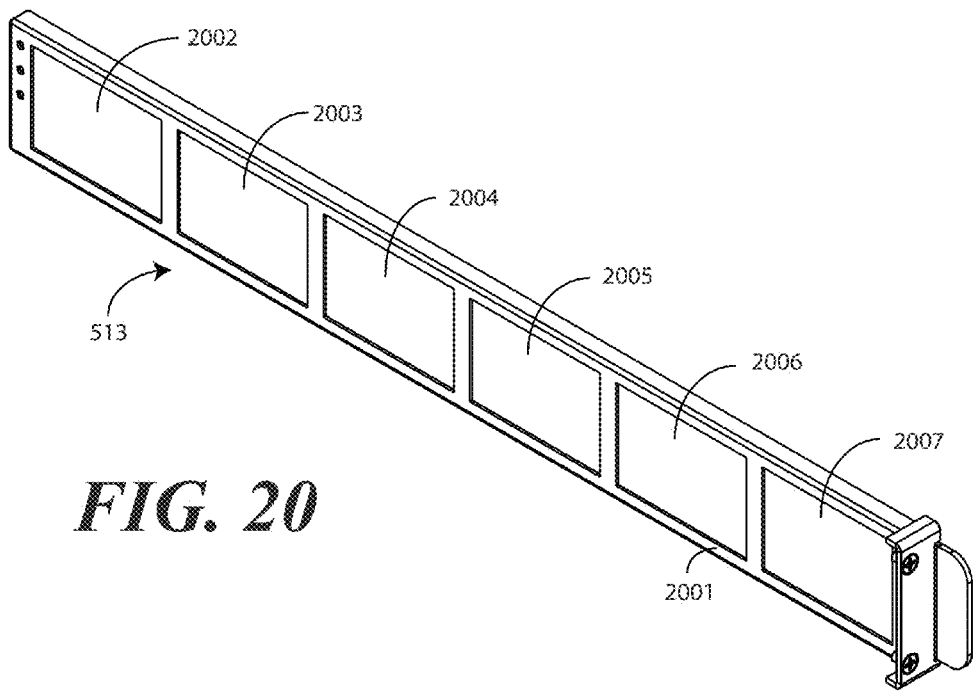
FIGS. 20-21 illustrate one explanatory air filter construct in accordance with one or more embodiments of the disclosure.
Figure 21:
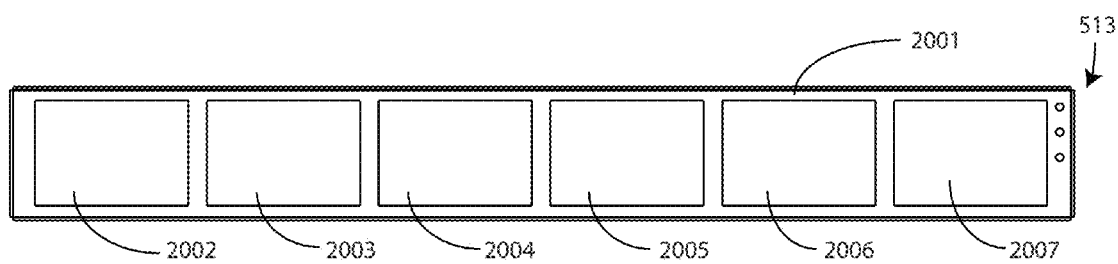

Turning now briefly to FIGS. 20 and 21, illustrated therein is one embodiment of the air filter 513. In one embodiment, the air filter 513 includes a mechanical chassis 2001 defining one or more panels 2002,2003,2004,2005,2006,2007 of filter material, which in one embodiment comprises foam or other filter material. In one embodiment, the filter material comprises 0.250-inch thick filter media with a 66 percent dust resistance per ASHRAE 52.1, and that is rated UL 94 HF-1. In one embodiment, the filter material measures 12.560 inches in length and 1.520 inches in height. In one embodiment, the mechanical chassis 2001 is manufactured from aluminum, and has a length of 12.6 inches and a height of 1.6 inches.

Turning now back to FIGS. 3-4, in one embodiment, the air inlet 301 measures approximately 5.10 by 1.70 inches, or 8.67 inches-square. In the illustrative embodiment of FIGS. 3 and 4, the grille spanning the air inlet 301 comprises approximately 184 hexagonal openings. In one embodiment, the grille is tied to a ground node (713) so as to serve as an electromagnetic interference shield to prevent electromagnetic interference from leaving the housing 101. In one embodiment, each hexagonal opening in the grille measures about 0.2 inches in diameter, i.e., the diameter of a circle circumscribing the hexagonal opening is about 0.2 inches, with opening of 0.035 inches-square. Accordingly, in this illustrative embodiment the total opening pore space in the grille is 6.36 inches-square. In one or more embodiments, the hexagonal openings extend over top and bottom bends of the grille.

In one embodiment, a first circuit card 302 and a second circuit card 303 can be inserted into, or removed from, the housing 101 through the front face 102. Similarly, a third circuit card 402 and a fourth circuit card 403 can be inserted into, or removed from the housing 101 through the rear face 203.

Figure 17:
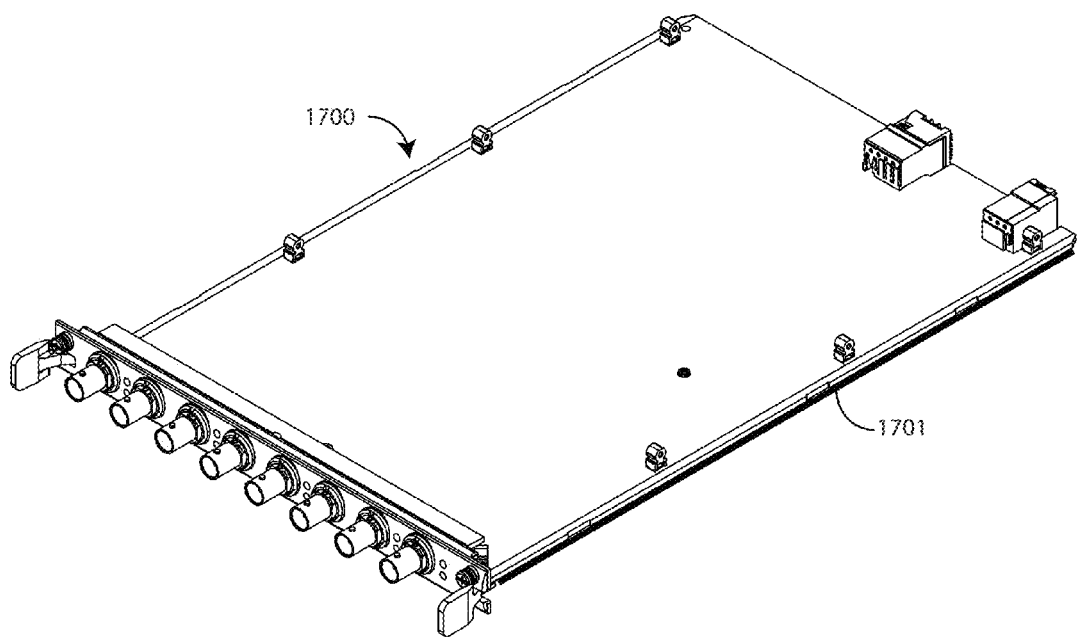
FIG. 17 illustrates one explanatory circuit card assembly in accordance with one or more embodiments of the disclosure.

Turning briefly to FIG. 17, illustrated therein is one explanatory circuit card 1700. In one or more embodiments, the circuit card 1700 has a depth of 12.5 inches and a width of 8 inches. Embodiments of the disclosure provide a vertical clearance above the top surface of the circuit card of between 0.60 and 0.62 inches for components. In one or more embodiments, the circuit card 1700 can be placed upon a metal carrier 1701 for insertion into the housing (101). In one or more embodiments, the circuit card 1700 has seven or more ounces of copper in traces, ground planes, and so forth, which serves as a heat sink. In other embodiments, the circuit card 1700 has between seven and nine ounces of copper, as this range has been shown to work well in practice. However, embodiments of the disclosure are not limited to these ranges of copper, and the amount of copper that becomes effective as a heat sink will vary based upon the electronics and power generation of each circuit card. Accordingly, the use of copper as a heat sink is optional. Further ranges other than the explanatory range set forth here will be obvious to those of ordinary skill in the art having the benefit of this disclosure.

Turning back to FIGS. 3 and 4, so as to be hot-swappable, in one embodiment a first set of circuit cards defined by the first circuit card 302 and the second circuit card 303 can be inserted through the front face 102 by translating the first circuit card 302 and the second circuit card 303 into the page as viewed in FIG. 3. Similarly, a second set of circuit cards defined by the third circuit card 402 and the fourth circuit card 403 can be inserted through the rear face 103 by translating the third circuit card 402 and the fourth circuit card 403 into the page as viewed in FIG. 4.

In the illustrative embodiment of FIGS. 3 and 4, the circuit cards are stacked vertically with each circuit card oriented parallel to the top surface 106 and the bottom surface 107 of the housing 101. For example, the first circuit card 302 is stacked atop the second circuit card 303, with the printed circuit boards of each of the first circuit card 302 and the second circuit card 303 oriented parallel to the top surface 106 and the bottom surface 107 of the housing 101. Similarly, the third circuit card 402 is stacked atop the fourth circuit card 403, with the printed circuit boards of each of the third circuit card 402 and the fourth circuit card 403 oriented parallel to the top surface 106 and the bottom surface 107 of the housing 101. As will be shown in subsequent figures, when so inserted into the housing 101, these printed circuit boards of each of the first circuit card 302, the second circuit card 303, the third circuit card 402, and the fourth circuit card 403 arranged horizontally so as to define a first circuit card corridor and a second circuit card corridor. In one or more embodiments, the volume about each circuit card is between sixty and sixty-two inches cubed. Accordingly, when cards are stacked as shown in FIGS. 3 and 4, each of the first circuit card corridor and the second circuit card corridor has a volume of between 120 and 124 inches cubed. These volumes are explanatory only, as others will be obvious to those of ordinary skill in the art having the benefit of this disclosure.

In one or more embodiments, a first fan module 304 extends into the housing 101 from the front face 102. Similarly, a second fan module 404 extends into the housing 101 from the rear face 203.

Figure 22:
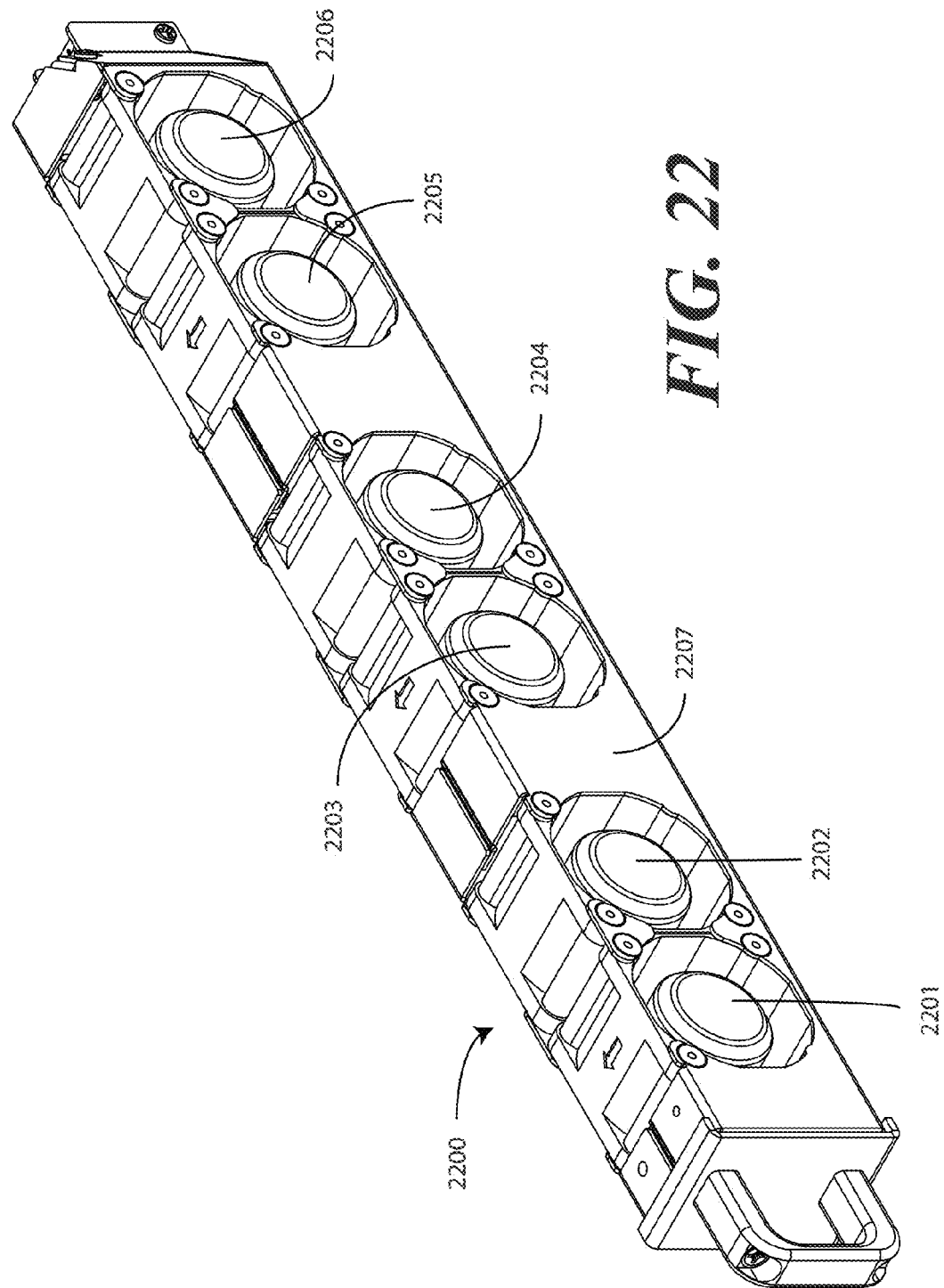
FIG. 22 illustrates one explanatory fan assembly in accordance with one or more embodiments of the disclosure.

Turning briefly to FIG. 22, illustrated therein is one explanatory fan module 2200. Each fan module can comprise an array of fans 2201,2202,2203,2204,2205,2206 carried by a housing called a carrier 2207. For example, in one embodiment a fan module 2200 includes six fans 2201,2202, 2203,2204,2205,2206 manufactured together as a single assembly that can be hot-swapped in an electronic device. If one or more fans 2201,2202,2203,2204,2205,2206 fail, a technician can simply remove the bank of fans 2201,2202, 2203,2204,2205,2206 defining the fan module 2200 and replace it with a new fan module. This saves time and is less expensive than having to open a chassis, determine which fan failed, replace that individual fan, and close the chassis.

When operating with a 12-volt output power supply, each fan can pull between 4.8 and 6.2 cubic feet per minute, assuming a 50 degrees centigrade operating temperature at 10,000 feet above sea level. When operating with a 13-volt output power supply, each fan can pull between 5.0 and 6.5 cubic feet per minute under similar conditions.

Turning now back to FIGS. 3-4, as with the circuit cards, so as to be hot swappable, in one embodiment the first fan module 304 can be inserted into the housing 101 through the front face 102, while the second fan module 404 can be inserted into the housing 101 through the rear face 203. This can occur by translating the first fan module 304 and the second fan module 404 into the page as viewed in FIGS. 3 and 4. The first fan module 304 and the second fan module 404 can be removed by translation in the opposite direction, i.e., out of the page as viewed in FIGS. 3 and 4.

In one or more embodiments, the first fan module 304 and the second fan module 404 are each operable to draw air into the housing 101 through the air inlet 301. In one embodiment, this occurs along a first direction, which is into the page as viewed in FIG. 3. The first fan module 304 and the second fan module 404 are then operable to draw the air across the first circuit card corridor defined by the first circuit card 302 and the second circuit card 303, and the second circuit card corridor defined by the third circuit card 402 and the fourth circuit card 403, respectively. In one embodiment, this occurs in a second direction different from the first direction, which is right to left across the page as viewed in FIG. 3, and vice versa in FIG. 4. The first fan module 304 and the second fan module 404 are then operable to draw air out of the housing 101 through the air exhaust 401 in a third direction different from the second direction, which is out of the page as viewed in FIG. 4. This will be shown in more detail in FIGS. 5-8 below.

Figure 7:
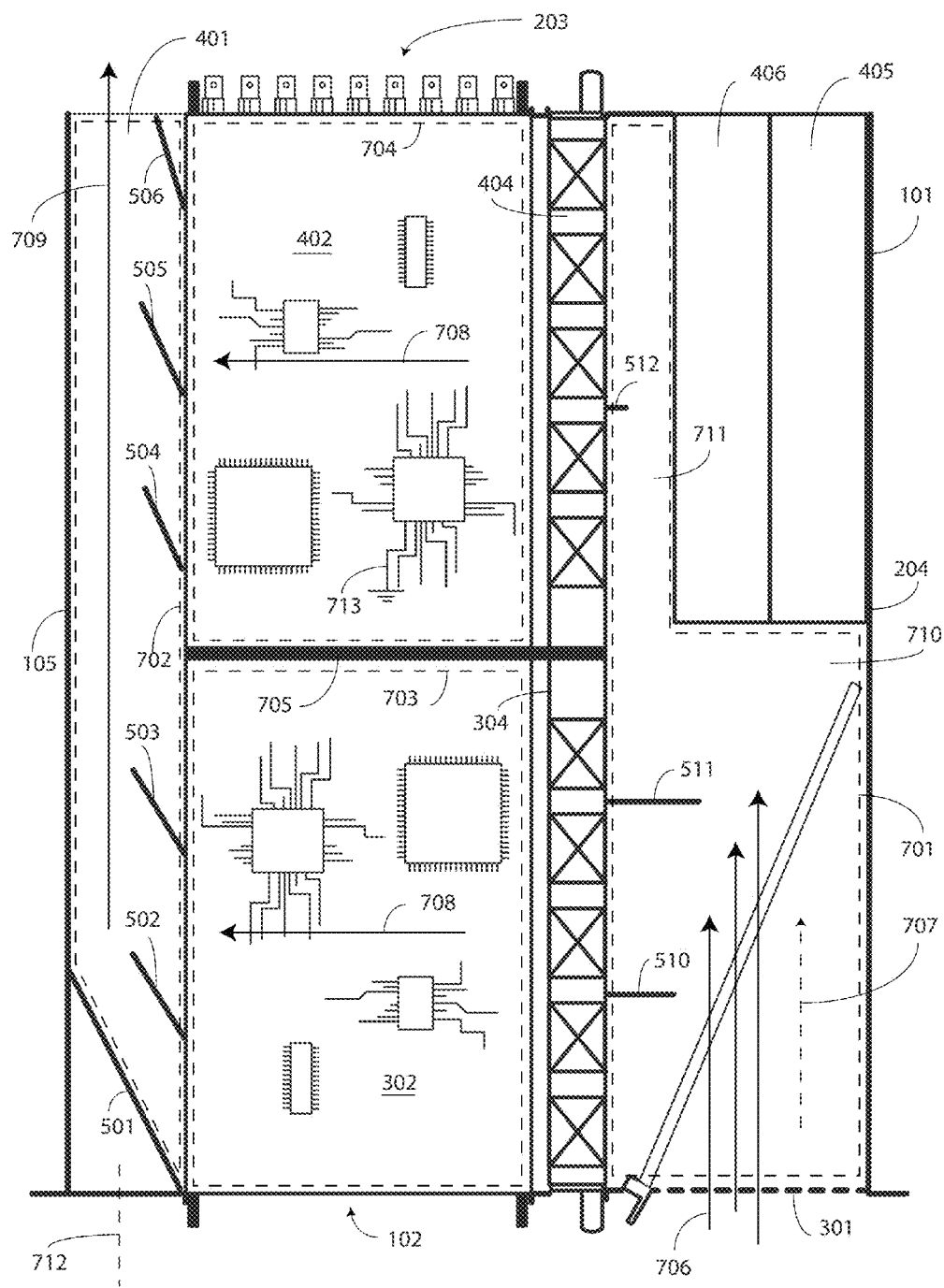
FIG. 7 illustrates a schematic block diagram of one explanatory electronic device employing a cooling system in accordance with one or more embodiments of the disclosure.

Turning now to FIG. 7, in one or more embodiments, the air 706 flowing into the air inlet 301, when the unit is operational and is using a 12-volt output power supply is about 82 cubic feet per minute. When using a 13-volt output power supply, the first fan module 304 and the second fan module 404 draw more air. In one embodiment, the air 706 flowing into the air inlet 301 with 13-volt output power supplies is about 86 cubic feet per minute. These measurements assume the device is operating at about fifty degrees centigrade at 10,000 feet above sea level.

In one or more embodiments, the air 706 flowing through the first circuit card corridor 703, when the unit is operational and is using a 12-volt output power supply is about 35 cubic feet per minute. When using a 13-volt output power supply, in one embodiment the air 706 flowing through the first circuit card corridor 703 is about 37 cubic feet per minute. These measurements assume the device is operating at about fifty degrees centigrade at 10,000 feet above sea level.

In one or more embodiments, the air 706 flowing through the second circuit card corridor 704, when the unit is operational and is using a 12-volt output power supply is about 33 cubic feet per minute. When using a 13-volt output power supply, in one embodiment the air 706 flowing through the second circuit card corridor 704 is about 35 cubic feet per minute. These measurements assume the device is operating at about fifty degrees centigrade at 10,000 feet above sea level.

Figure 8:
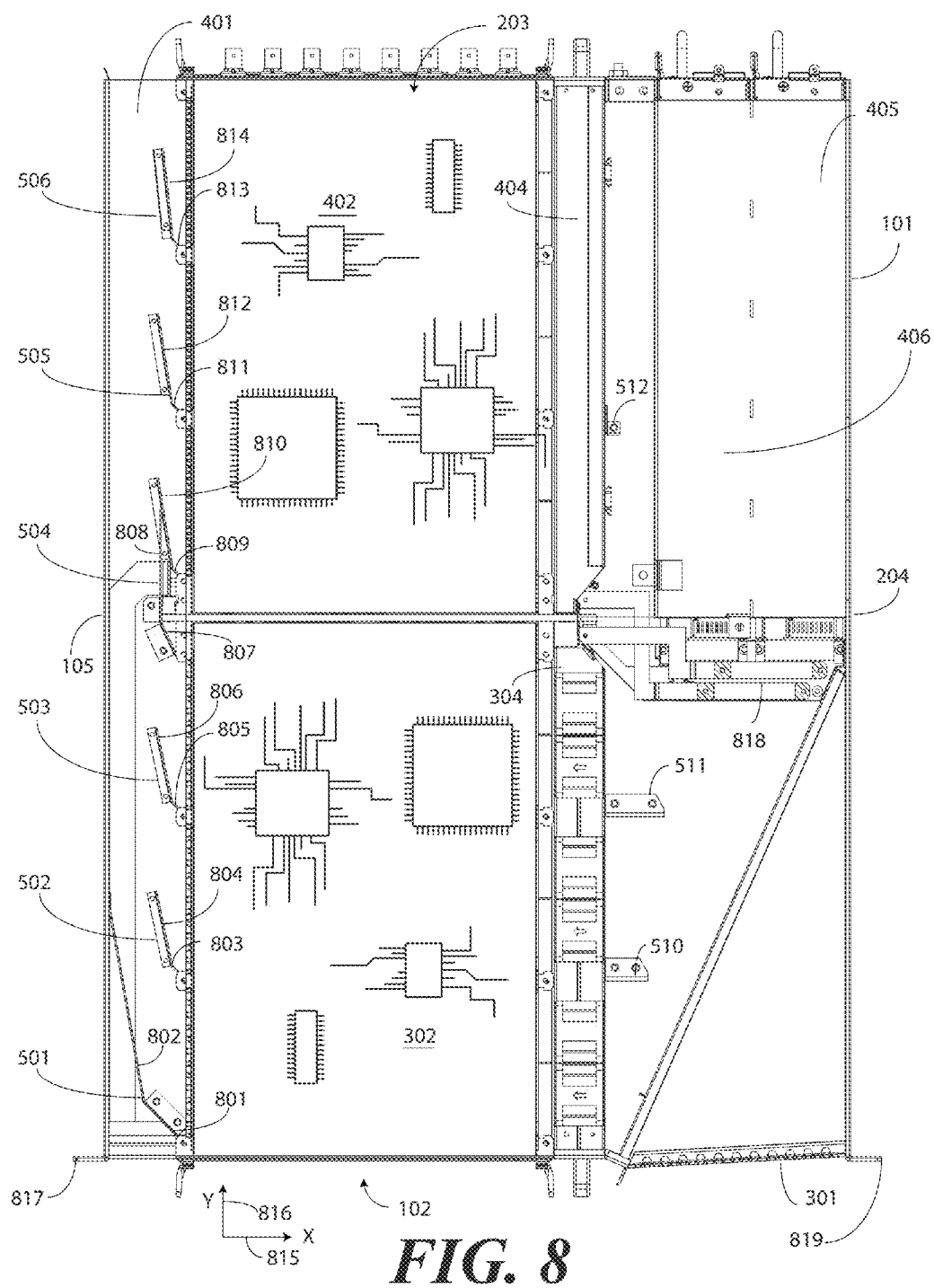
FIG. 8 illustrates a top plan view of an interior of one explanatory electronic device employing a cooling system in accordance with one or more embodiments of the disclosure.

In one embodiment, a first power supply 405 and a second power supply 406 can be inserted into the housing 101 through the rear face 203. In one embodiment, the first power supply 405 and the second power supply 406 are redundant power supplies, in that each power supply can fully power the electronics disposed along each of the first circuit card 302, the second circuit card 303, the third circuit card 402, the fourth circuit card 403, the first fan module 304 and the second fan module 404. In this illustrative embodiment, the first power supply 405 and the second power supply 406 are disposed in the fourth quadrant 114 of the housing 101. One suitable power supply for use with embodiments of the disclosure is Slimline.Sup.™ power supplies manufactured by GE Industrial Solutions, Inc. Others will be obvious to those of ordinary skill in the art having the benefit of this disclosure. As best shown in FIG. 8, busbars 818 can be used to deliver power to the first circuit card 302, the second circuit card 303, the third circuit card 402, the fourth circuit card 403, the first fan module 304, and the second fan module 404 without impeding airflows.

In one or more embodiments, each of the first power supply 405 and the second power supply 406 includes its own internal fan. Accordingly, as best shown in FIG. 7 some of the air 706 entering the air input passes through the power supplies. Assuming the device is operating at about fifty degrees centigrade at 10,000 feet above sea level, each power supply draws roughly seven cubic feet per minute through its housing.

Advantageously, embodiments of the disclosure provide a housing 101 that facilitates the replacement of four modular circuit cards, i.e., the first circuit card 302, the second circuit card 303, the third circuit card 402, and the fourth circuit card 403. The first circuit card 302 and the second circuit card 303, and the third circuit card 402 and the fourth circuit card 403, are replaceable through the front face 102 and the rear face 203 of the housing 101, respectively. Additionally, the first fan module 304 and the second fan module 404 are also hot swappable through the front face 102 and the rear face 203, respectively. The first power supply 405 and the second power supply 406 are likewise hot swappable through the rear face 203 of the housing 101. By making the housing 101 modular, i.e., by allowing circuit cards, fans, or power supplies to be swapped without taking the electronic device disposed within the housing 101 off-line, repairs and product enhancements can be performed by simply installing a new circuit card, new fan, or new power supply into the housing 101 while it is still operational. Hot-swappable fan modules allow technicians to repair "worn out" cooling components without interrupting system operation. The inclusion of hot-swappable fan modules and circuit cards advantageously increase the reliability and usable life span of the electronic device.

Accordingly, the front face 102 and the rear face 103 of the housing 101 allow service personnel to remove and replace all circuit cards, fan modules, and power supplies while the device remains operational and fully coupled to a rack by way of the rack mounts 108,109. Despite providing a front face 102 and rear face 103 with sufficient real estate to hot-swap these components, the air inlet 301 and the air exhaust 401 sufficiently provide volumes for cooling through the various plenums within the housing 101. The front face 102 and rear face 103 further offer sufficient surface area for the optical and electrical connections required to connect to the electronics disposed along the first circuit card 302, the second circuit card 303, the third circuit card 402, and the fourth circuit card 403, respectively, to adjacent headend equipment.

Figure 5:
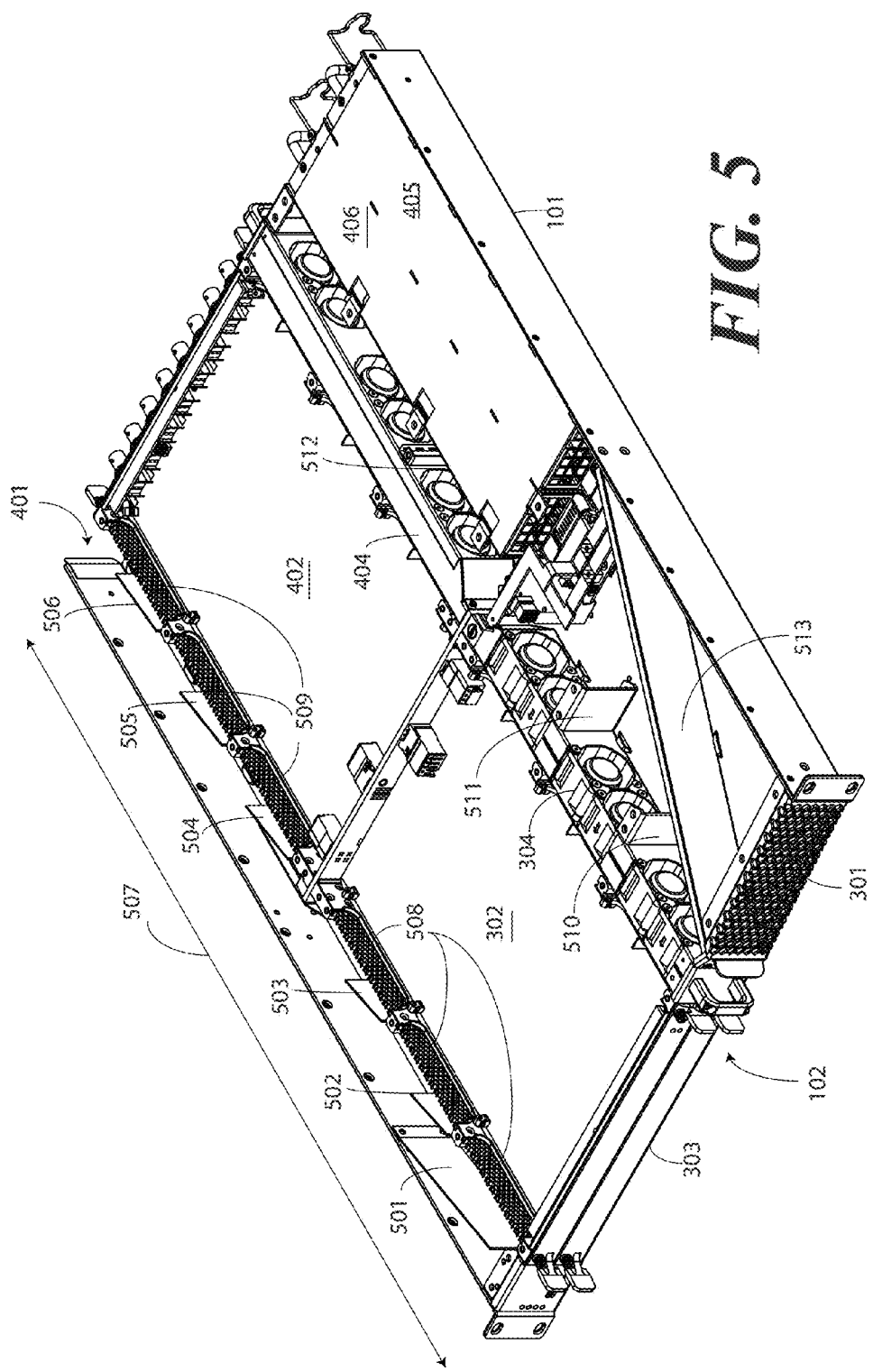
FIG. 5 illustrates a perspective view of an interior of one explanatory electronic device employing a cooling system in accordance with one or more embodiments of the disclosure.
Figure 6:
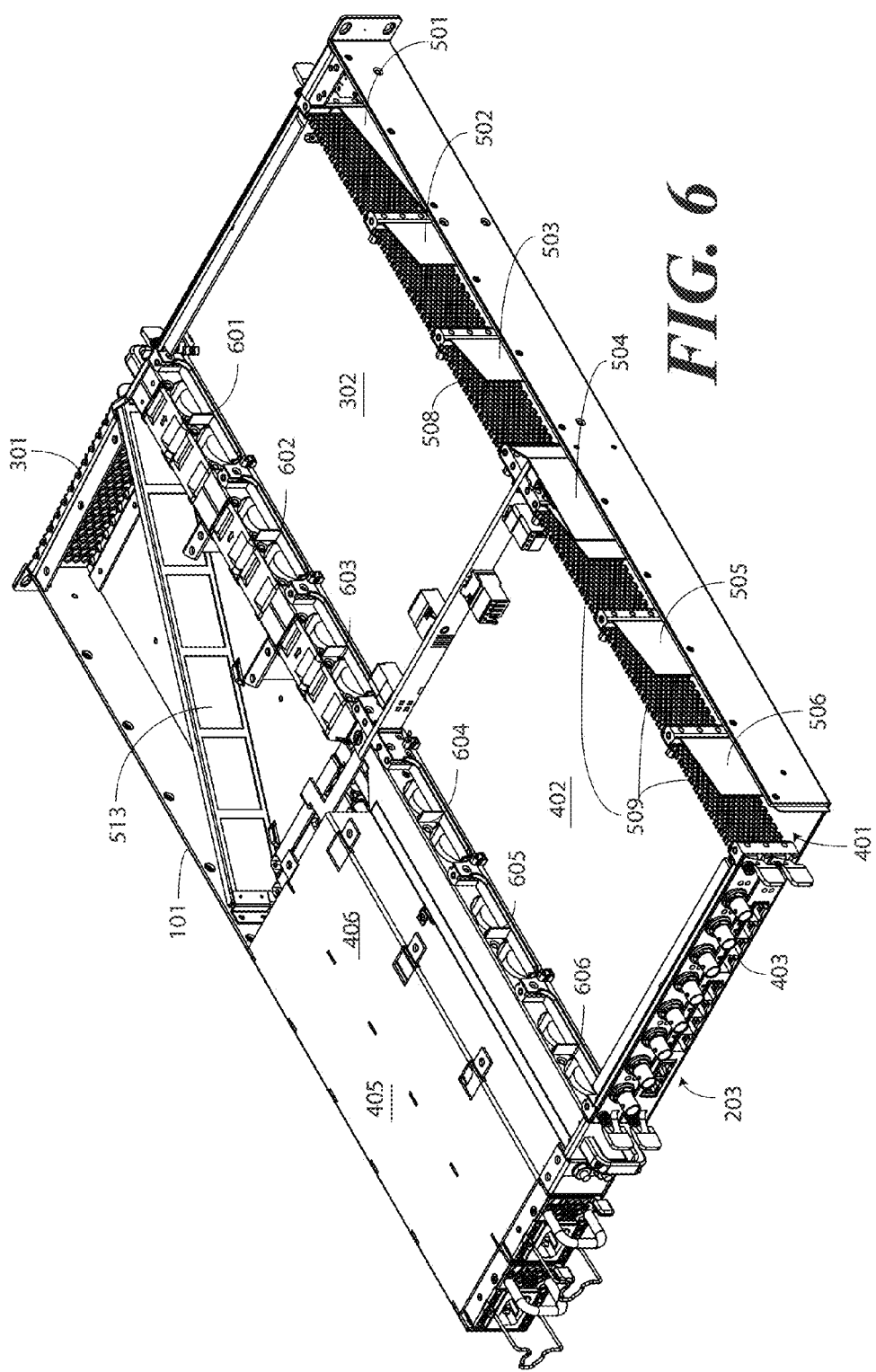
FIG. 6 illustrates another perspective view of an interior of one explanatory electronic device employing a cooling system in accordance with one or more embodiments of the disclosure.

Turning now to FIGS. 5-8, illustrated therein are internal plenums, volumes, components, orientations, and component arrangements configured in accordance with one or more embodiments of the disclosure. FIG. 5 illustrates a front right top perspective view, while FIG. 6 illustrates a rear, left, top perspective view. FIG. 7 illustrates a basic schematic block diagram to make airflows and plenums more readily visible by showing only basic components, while FIG. 8 provides a more detailed top plan view.

Shown in these figures are the front face 102 and the rear face 203 of the housing 101, respectively. Also shown are the air inlet 301 and the air exhaust 401. The first circuit card 302 and the second circuit card 303 are inserted into the housing 101 through the front face 102. Similarly, a third circuit card 402 and a fourth circuit card 403 are inserted into the housing 101 through the rear face 203.

As best seen in the schematic block diagram of FIG. 7, in one embodiment a first plenum 701 is disposed adjacent to the air inlet 301, while a second plenum 702 is disposed adjacent to the air exhaust 401. In this illustrative embodiment, the first plenum 701 is bounded by the air inlet 301, the first fan module 304, the second fan module 404, the first power supply 405, the second power supply 406, and the first sidewall 204. In this illustrative embodiment, the first plenum 701 is defined by a volume having an L-shape. While an L-shape is one explanatory shape due to the fact that the first power supply 405 and the second power supply 406 are each inserted into the housing 101 into the first plenum 701, thereby defining the L-shape, other configurations will be obvious to those of ordinary skill in the art having the benefit of this disclosure. Also, it should be noted that the first plenum 701 can have an L-shape that is not perfect. For example, in this embodiment, the base 710 of the L-shape is exaggerated so as to be large compared with the top 711 of the L-shape. Further, as different shaped power supplies are inserted into the housing 101, the top 711 and bottom 710 of the L-shape may be imperfect as well.

The first circuit card 302 and the second circuit card 303 are inserted into the housing 101 through the front face 102, while the third circuit card 402 and the fourth circuit card 403 are inserted into the housing 101 through the rear face 203. In this embodiment, each circuit card is inserted so as to engage a barrier wall 705. In this illustrative embodiment, the circuit cards are stacked vertically with each circuit card oriented parallel to the top surface (106) and the bottom surface (107) of the housing 101. The first circuit card 302 is stacked atop the second circuit card 303, with the printed circuit boards of each of the first circuit card 302 and the second circuit card 303 oriented parallel to the top surface (106) and the bottom surface (107) of the housing 101. Similarly, the third circuit card 402 is stacked atop the fourth circuit card 403, with the printed circuit boards of each of the third circuit card 402 and the fourth circuit card 403 oriented parallel to the top surface (106) and the bottom surface (107) of the housing 101.

In such a configuration, as best shown in FIG. 7, when so inserted into the housing 101, these printed circuit boards of each of the first circuit card 302, the second circuit card 303, the third circuit card 402, and the fourth circuit card 403 arranged horizontally so as to define a first circuit card corridor 703 and a second circuit card corridor 704. In this embodiment, the first circuit card corridor 703 and the second circuit card corridor 704 are both disposed between the first plenum 701 and the second plenum 702. In this illustrative embodiment, the barrier wall 705 separates the first circuit card corridor 703 and the second circuit card corridor 704.

The first fan module 304 extends into the housing 101 from the front face 102. Similarly, a second fan module 404 extends into the housing 101 from the rear face 203. In this embodiment, the first fan module 304 and the second fan module 404 are the same in configuration. However, the second fan module 404 has been turned upside down relative to the first fan module 304 to be inserted into the rear face 203. This inversion allows a single, non-symmetrical fan module to be inserted into both the front face 102 and the rear face 203, thereby reducing the overall part count for the system. In one embodiment, each of the first fan module 304 and the second fan module 404 comprises the fan module (2200) of FIG. 22. The first power supply 405 and the second power supply 406 are inserted into the housing 101 through the rear face 203.

In this embodiment, the first fan module 304 extends into the housing 101 from the front face 102 to the barrier wall 705 and is disposed between the first plenum 701 and the first circuit card corridor 703. Also, the second fan module 404 extends into the housing 101 from the rear face 203 to the barrier wall 705 and is disposed between the first plenum 701 and the second circuit card corridor 704. In this embodiment, each of the first fan module 304 and the second fan module 404 comprises a hot-swappable fan module that can be replaced without taking the electronic device (100) off line.

In this embodiment, the first fan module 304 is disposed adjacent to, and is oriented orthogonally with, the front face 102. Accordingly, the first fan module is operable to redirect air 706 entering the air inlet 301 from a first direction 707 to a second direction 708. Similarly, the second fan module 404 is disposed adjacent to, and is oriented orthogonally with, the rear face 203 so as to be operable to redirect air 706 entering the air inlet 301 from the first direction 707 to the second direction 708.

As such, a "dual cooling path" configuration is established with a first cooling path passing from the first plenum 701 through the first circuit card corridor 703 to the second plenum 702 along a first side of the barrier wall 705, and a second cooling path passing from the first plenum 701 through the second circuit card corridor 704 to the second plenum 702 on a second side of the barrier wall 705. Said differently, in this illustrative embodiment the first circuit card corridor 703 defines a first cooling path to a first side of the barrier wall 705, while the second circuit card corridor 704 defines a second cooling path to a second side of the barrier wall 705. This dual cooling path configuration ensures that sufficient air reaches each of the first circuit card 302 and the second circuit card 303, and the third circuit card 402 and the fourth circuit card 403, respectively.

In this illustrative embodiment, the first fan module 304 and the second fan module 404 are each operable to draw air 706 into the housing 101 through the air inlet 301 along a first direction 707. The first fan module 304 and the second fan module 404 are then each operable to draw the air 706, across the first circuit card corridor 703 and the second circuit card corridor 704, respectively, in a second direction 708 that is different from the first direction 707. In one embodiment, the second direction 708 is parallel to the front face 102 and the rear face 203. Next, the first fan module 304 and the second fan module 404 are each operable to push air 706 out of the housing 101 through the air exhaust 401 in a third direction 709 different from the second direction 708. In this illustrative embodiment, the first direction 707 and the third direction 709 are substantially parallel, and run substantially parallel to the first sidewall 204 and the second sidewall 105. Moreover, in this illustrative embodiment the second direction 708 is substantially orthogonal to the first direction 707 and the third direction 709.

As noted above, in this illustrative embodiment the first plenum 701 is defined by a volume having an L-shape. Accordingly, in this embodiment the first circuit card corridor 703 is disposed adjacent to a base 710 portion of the L-shape, while the second circuit card corridor 704 is disposed adjacent to the top 711 of the L-shape. Additionally, the first power supply 405 is adjacent to the second power supply 406 such that the power supplies collectively are disposed in a complementary configuration with the L-shape between the base 710 portion of the L-shape and the top 710 or upper portion of the L-shape. When using Slimline.Sup.™ power supplies, the area occupied by first power supply 405 and the second power supply 406 is about 56.5 inches square. In a 1RU chassis design, the volume occupied by the first power supply 405 and the second power supply 406 is about 90.4 inches cubed.

In one embodiment, the area of the base 710 of the L-shape is between sixty and eighty inches square, and preferably between seventy and seventy-five inches square. For example, in one embodiment the area of the base 710 of the L-shape is about 72.6 inches square. In a 1RU chassis design, the volume of the base 710 of the L-shape is between 100 and 130 inches cubed, and in one embodiment is 116.2 inches cubed. Similarly, the area of the top 711 of the L-shape can vary. In one embodiment, this area is between twelve and seventeen inches square. In one embodiment the top 711 of the L-shape is about 15.4 inches square. In a 1RU chassis design, the volume of the top 711 of the L-shape is between twenty-two and twenty six inches cubed. In one illustrative embodiment, the volume of the top 711 of the L-shape is about 24.6 inches cubed.

In one embodiment, the area of the second plenum 702 is between thirty-five and fifty inches square. For example, in one embodiment the area of the second plenum 702 is about 39.9 inches square. In another embodiment, the area of the second plenum is about 44.8 inches square. The volume of the second plenum 702 can vary as well. In a 1RU chassis design, the area can vary between sixty and seventy-five inches cubed. In one illustrative embodiment, the volume of the second plenum 702 is about 63.8 inches cubed. In another embodiment, the volume of the second plenum is about 71.7 inches cubed. The volume can be between these illustrative volumes as well.

In one or more embodiments, a first honeycomb grid 508 and a second honeycomb grid 509 are disposed between the first circuit card corridor 703 and the second circuit card corridor 704, respectively, and the second plenum 702. In one or more embodiments, each of the first honeycomb grid 508 and the second honeycomb grid 509 are manufactured from an electrically conductive metal and are tied to a ground node 713 to provide electromagnetic shielding. This electromagnetic shielding helps to ensure that electromagnetic noise generated by the electronic circuitry on the first circuit card 302, the second circuit card 303, the third circuit card 402, and the fourth circuit card 403 remains within the housing 101 and does not escape through the air exhaust 401.

Figure 19:
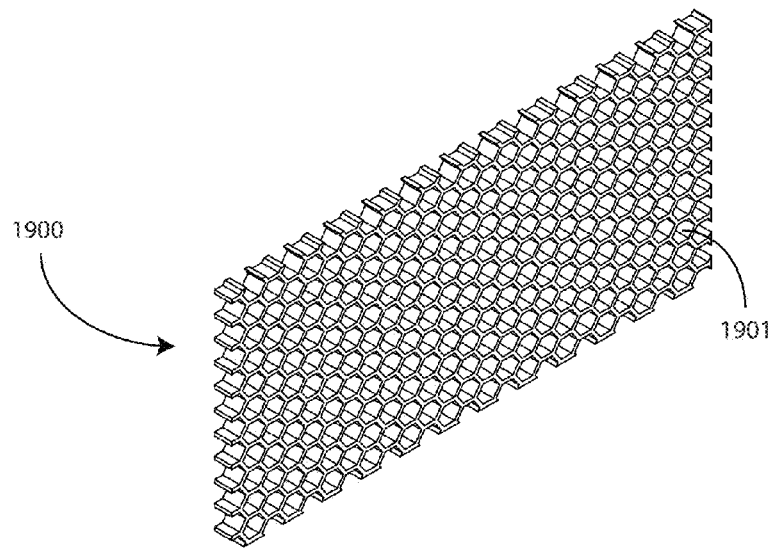
FIG. 19 illustrates one explanatory air conduit in accordance with one or more embodiments of the disclosure.

Turning briefly to FIG. 19, illustrated therein is one explanatory honeycomb grid 1900. In one or more embodiments, each honeycomb grid 1900 measures about 3.5 inches by 1.63 inches, with three segments of the honeycomb grid 1900 used in combination to form either the first honeycomb grid (508) or the second honeycomb grid (509) of FIG. 5. In one embodiment, the honeycomb grid 1900 is about 0.125 inches thick.

In one or more embodiments, the honeycomb grid 1900 is manufactured from a water jet cutting process so as to preserve the precise shape of each honeycomb 1901. In one embodiment, the honeycomb grid 1900 is manufactured from aluminum. Each honeycomb grid 1900 is inserted into vertical aluminum card guide struts in one embodiment to form either the first honeycomb grid (508) or the second honeycomb grid (509) of FIG. 5. The struts can be grounded within the housing (101). In one embodiment, the effective airflow area through the honeycomb grid 1900 is slightly reduced to 3.41×1.60 inches due to the recesses. As shown in FIG. 5, there are total of six honeycomb grids 1900 defining either the first honeycomb grid 508 or the second honeycomb grid 509. These provide electromagnetic interference containment with minimum airflow impedance along the entire length of the module exhaust.

Turning now back to FIGS. 5-8, in one embodiment, one or more baffles 501,502,503,504,505,506 are disposed within the second plenum 702 to direct the air 706 from the first fan module 304 and the second fan module 404 to the air exhaust 401. In this illustrative embodiment, the one or more baffles 501,502,503,504,505,506 comprises a plurality of baffles disposed along a length 507 of the second plenum 702 to direct the air 706 from the first fan module 304 and the second fan module 404 to the air exhaust 401. In one embodiment, the plurality of baffles are each oriented at different angles relative to an axis 712 defined by the length of the second plenum 702. Moreover, each baffle can comprise an angled baffle with a first portion extending to a bend, followed by a second portion extending from the bend.

Illustrating by example, as best shown in FIG. 8, baffle 501 includes a first portion 801 and a second portion 802 that meet at a bend. Similarly, baffle 502 includes a first portion 803 and a second portion 804 that join at a bend. To provide illustrative dimensional guidance for illustrative baffles configured in accordance with elements of the disclosure, the following table lists coordinates measured along the X-axis 815 and Y-axis 816, with the origin being corner 817 of the housing 101. Additionally, angles relative to the front face 102 are provided as well. It should be noted that these dimensions are illustrative only, as others will be readily obvious to those of ordinary skill in the art having the benefit of this disclosure. Additionally, it should be noted that baffle 504 is comprised of two separate baffles: a first baffle with a first portion 807 and a second portion 808, and a second baffle with a first portion 809 and a second portion 810. In the illustrative embodiment of FIG. 8, the distance from corner 817 to corner 819 is about 18.960 inches.

TABLE 1

| BAFFLE | PORTION | REF. DES. | START X-Y (inches) | END X-Y (inches) | ANGLE (degrees) |
|---|---|---|---|---|---|
| 501 | First | 801 | 2.468, 0.493 | 1.677, 1.284 | 135 |
|  | Second | 802 | 1.677, 1.284 | 0.877, 5.819 | 100 |
| 502 | First | 803 | 2.473, 4.344 | 2.336, 4.473 | 137 |
|  | Second | 804 | 2.336, 4.473 | 1.963, 6.223 | 102 |
| 503 | First | 805 | 2.473, 8.194 | 2.336, 8.323 | 137 |
|  | Second | 806 | 2.336, 8.323 | 1.963, 10.073 | 102 |
| 504 (first) | First | 807 | 2.385, 11.782 | 2.044, 12.516 | 115 |
|  | Second | 808 | 2.044, 12.516 | 2.044, 15.216 | 90 |
| 504 (second) | First | 809 | 2.471, 13.673 | 2.340, 13.809 | 134 |
|  | Second | 810 | 2.340, 13.809 | 2.005, 15.921 | 99 |
| 505 | First | 811 | 2.471, 17.523 | 2.340, 17.659 | 134 |
|  | Second | 812 | 2.340, 17.659 | 2.005, 19.771 | 99 |
| 506 | First | 813 | 2.473, 21.373 | 2.350, 21.515 | 131 |
|  | Second | 814 | 2.350, 23.515 | 2.126, 23.642 | 96 |

In one or more embodiments, additional baffles 510,511,512 can extend into the first plenum 701 from the first fan module 304 and the second fan module 404. The inclusion of these additional baffles 510,511,512 can help to ensure that sufficient amounts of air reach the top 711 of the L-shape to pass through the second fan module 4104 into the second circuit card corridor 704. In this illustrative embodiment, a first baffle 510 and a second baffle 511 extend into the first plenum 701 from the first fan module 304, while a third baffle 512 extends into the first plenum 701 from the second fan module 404.

As with the baffles disposed in the second plenum 702, to provide illustrative dimensional guidance for illustrative baffles configured in accordance with elements of the disclosure, the following table lists coordinates measured along the X-axis 815 and Y-axis 816, with the origin being corner 817 of the housing 101. In one illustrative embodiment, each of these additional baffles 510,511,512 extends into the first plenum 701 substantially parallel to the front face 102 and the rear face 203. It should be noted that these dimensions are illustrative only, as others will be readily obvious to those of ordinary skill in the art having the benefit of this disclosure.

TABLE 2

| BAFFLE | START X-Y | END X-Y |
|---|---|---|
| 501 | 12.481, 4.119 | 13.481, 4.119 |
| 502 | 12.481, 7.969 | 13.861, 7.969 |
| 503 | 12.481, 16.917 | 12.825, 16917 |

In one or more embodiments, as best seen in FIG. 6, one or more baffles 601,602,603,604,605,606 can be disposed between the first fan module 304 and the second fan module 404 and the first circuit card corridor 703 and the second circuit card corridor 704. In this illustrative embodiment, three baffles 601,602,603 are disposed between the first fan module 304 and the first circuit card corridor 703, while three baffles 604,605,606 are disposed between the second fan module 404 and the second circuit card corridor 704.

Figure 18:
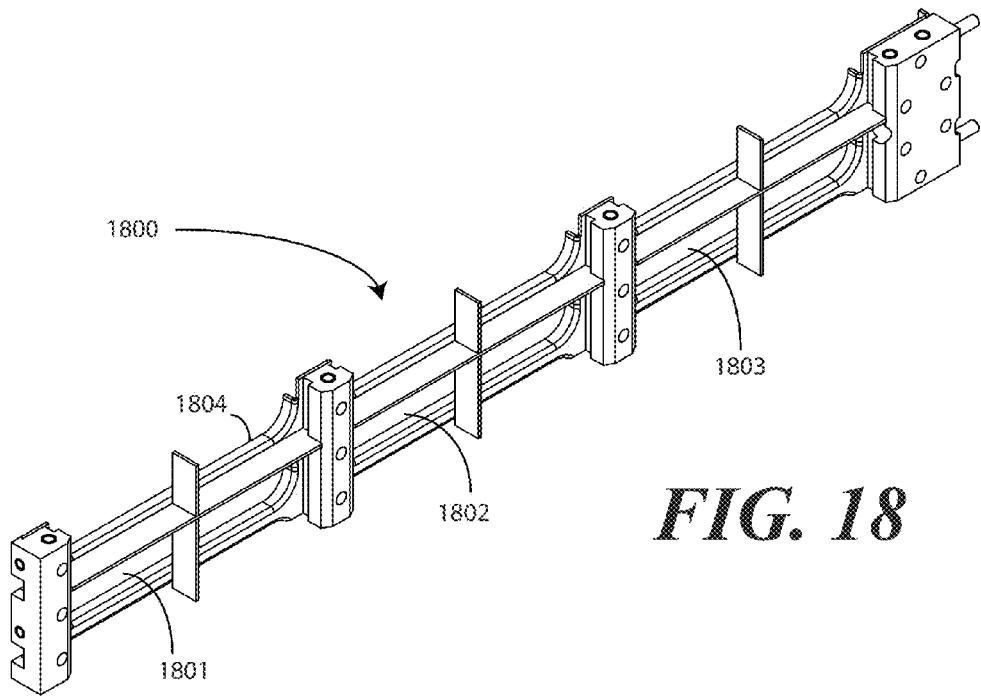
FIG. 18 illustrates one explanatory mechanical structure in accordance with one or more embodiments of the disclosure.

In one embodiment, a mechanical structure comprises each of these baffles 601,602,603,604,605,606. Turning briefly to FIG. 18, illustrated therein is one such mechanical structure 1800. The mechanical structure 1800 of FIG. 18 includes inlet ducts 1801,1802,1803 that are built into a card guide assembly 1804 configured to receive circuit cards.

Figure 10:
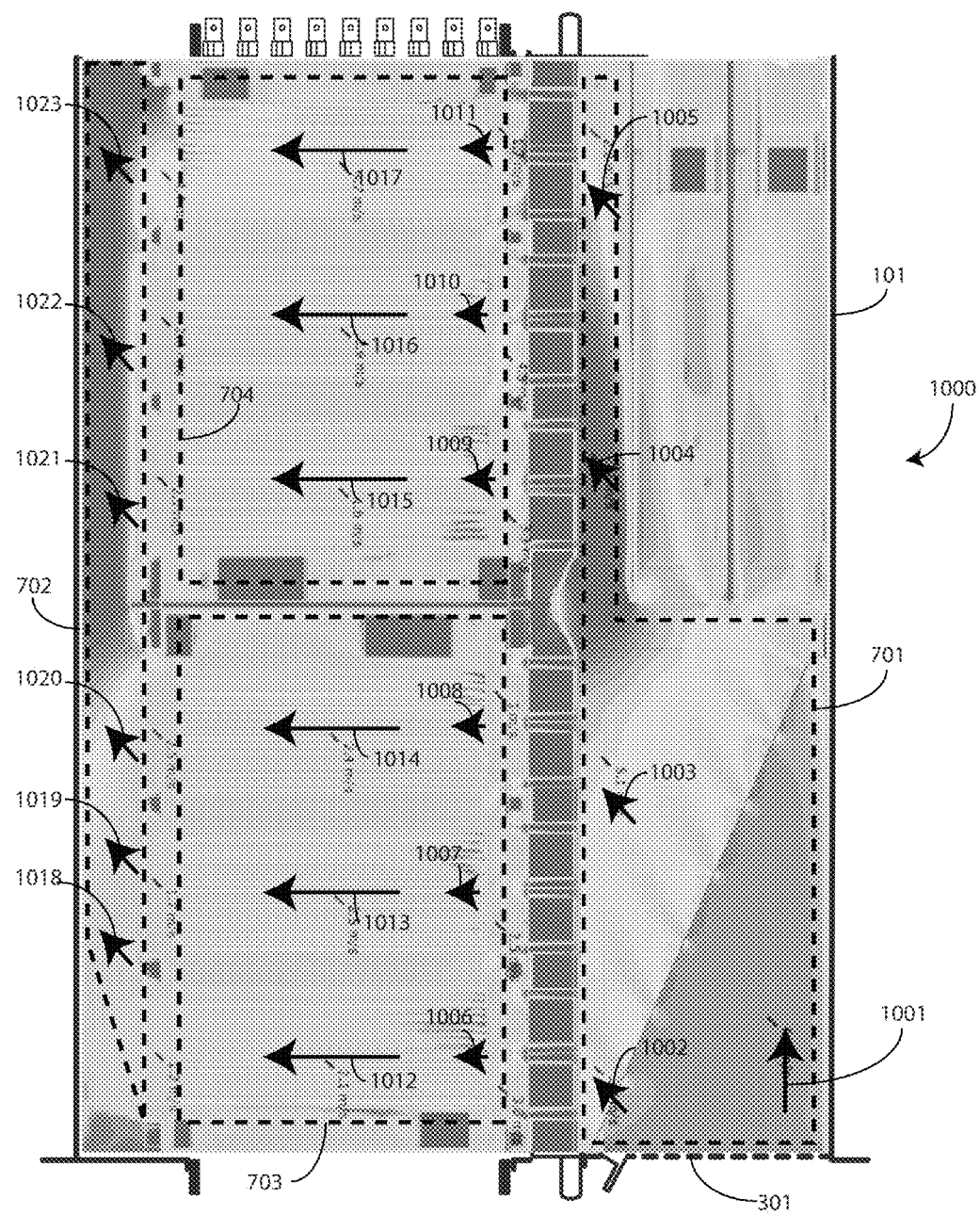
FIG. 10 illustrates cooling occurring in one explanatory electronic device employing a cooling system in accordance with one or more embodiments of the disclosure.
Figure 11:
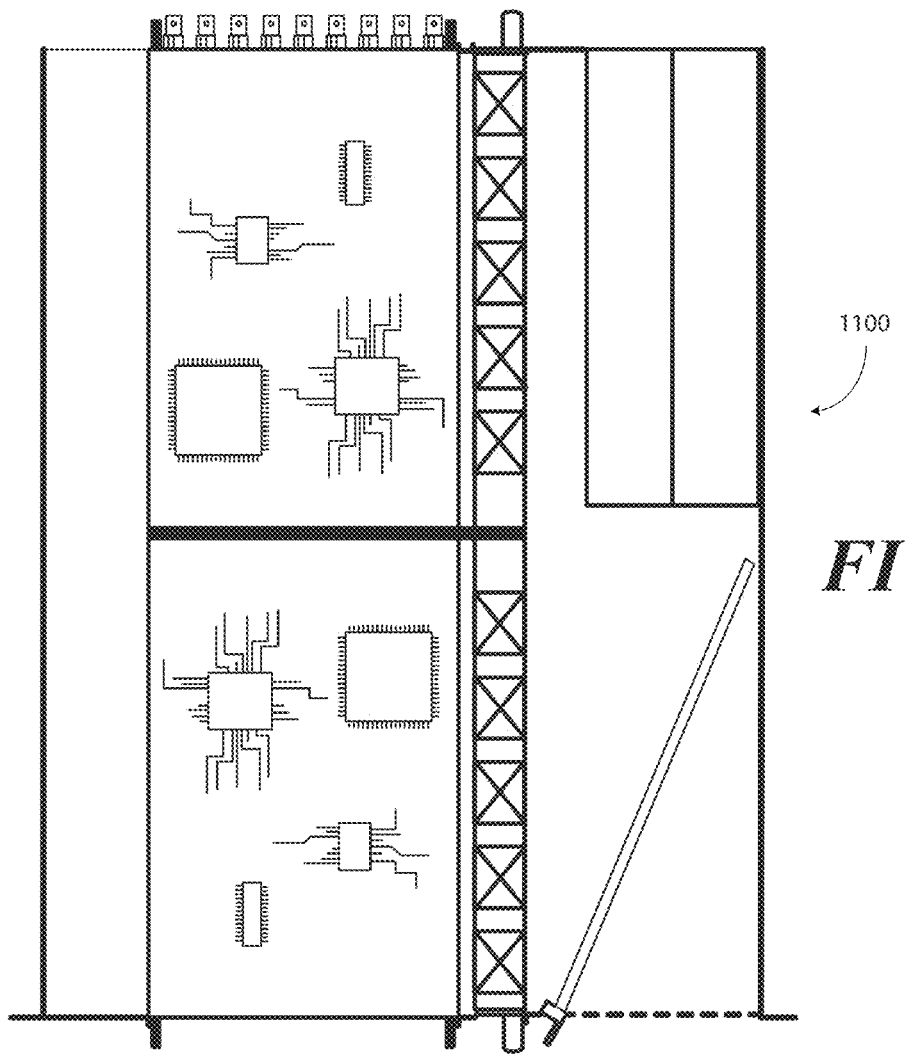
FIG. 11 illustrates a top plan view of an interior or another explanatory electronic device employing another cooling system in accordance with one or more embodiments of the disclosure.
Figure 12:
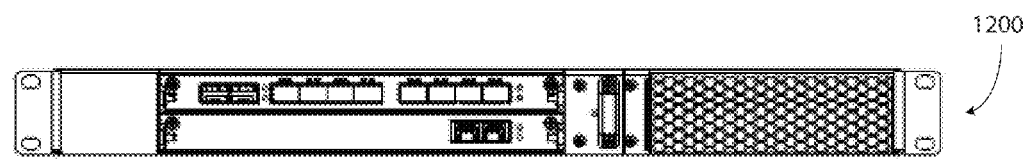
FIG. 12 illustrates a front elevation view of another explanatory electronic device employing another cooling system in accordance with one or more embodiments of the disclosure.
Figure 13:
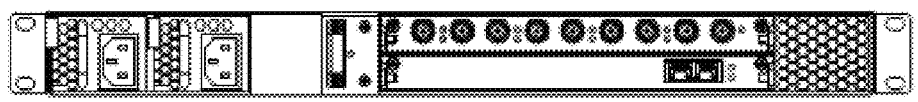
FIG. 13 illustrates a rear elevation view of another explanatory electronic device employing another cooling system in accordance with one or more embodiments of the disclosure.

In one embodiment, one horizontal duct is placed at the midline of the top guide. Then a vertical duct placed at the center of the horizontal duct between adjacent fans. The horizontal duct is secured into the card guide assembly by 'keyway' saw cuts in the vertical struts. In one embodiment, the exposed size of the horizontal duct is 3.41×0.32 inches. The vertical duct is secured to the horizontal duct by the use of keyed notch cut into both ducts, the assembly process traps the vertical duct into the assembly then a single tack weld is placed at the intersection of the ducts at the fan side. This tack weld keeps the vertical duct perpendicular to the horizontal duct. The vertical duct measures 1.60×0.32 inches in one embodiment. These ducts reduce flow bypass, in the event of two circuit cards with different impedances being loaded in top and bottom slots, or bypass due to adjacent fan failure. These ducts also play a role in better directing the airflow into the cooling chambers Thermal analyses confirm that the inclusion of the baffles described above provide cooling benefits. Turning to FIG. 10, illustrated therein is a thermal analysis of a cooling system 1000 that includes the components described above, but without any of the baffles. A schematic block diagram 1100 of the cooling system 1000 is shown in FIG. 11, while a front view of the chassis 1200 and a rear view of the chassis 1200 are shown in FIGS. 12 and 13, respectively. As shown in the thermal analysis, various temperatures and airflows are shown. These airflows are set forth in the table below.

TABLE 3

| AIR FLOW REFERENC DESIGNATOR | SPEED (METERS PER SECOND) |
|---|---|
| 1001 | 6.8 |
| 1002 | 3.9 |
| 1003 | 5.1 |
| 1004 | 11 |
| 1005 | 2.2 |
| 1006 | 3.8 |
| 1007 | 2.5 |
| 1008 | 1 |
| 1009 | 3.3 |
| 1010 | 4.5 |
| 1011 | 1.7 |
| 1012 | 2.1 |
| 1013 | 2.5 |

TABLE 3-continued

| AIR FLOW REFERENC DESIGNATOR | SPEED (METERS PER SECOND) |
|---|---|
| 1014 | 2.4 |
| 1015 | 1.6 |
| 1016 | 2.9 |
| 1017 | 4.7 |
| 1018 | 1.2 |
| 1019 | 1.7 |
| 1020 | 2.5 |
| 1021 | 2.1 |
| 1022 | 2.3 |
| 1023 | 4.4 |

From this thermal analysis, a few points became apparent. There were several forms of airflow imbalance within the chassis. To begin, airflow was not evenly split between the first circuit card corridor 703 and the second circuit card corridor 704. Second, within each of the first circuit card corridor 703 and the second circuit card corridor 704 airflow was defined by three discrete cooling zones, with each cooling zone cooled by a pair of fans in a fan module. Third, it was desirable to split airflow evenly between upper and lower circuit cards in each of the first circuit card corridor 703 and the second circuit card corridor 704. Fourth, it was desirable to make sure the airflow was tolerant to several different types of processing modules, with vastly different physical layouts along each circuit card. The airflow numbers also suggested that high performance fans would be required due to the high impedance of the system.

From this initial analysis, iterative thermal analyses were performed to fully optimize embodiments described above. During this optimization, dimensions of the circuit cards were optimized, as well as the critical width of the first plenum 701 and the second plenum 702. The dimensions of the housing 101 remained constant, as it was desirable to keep these dimensions in conformity with those of a standard 1RU chassis. These constraints became the main factor to locating (and sizing) the circuit cards disposed within the housing 101.

Once the airflow through the first plenum 701 and second plenum 702 was balanced, attention was given to airflow through the first circuit card corridor 703 and the second circuit card corridor 704. This resulted in the inclusion of the baffles described above. These ducts provide flow control to the discrete cooling zones of the first circuit card corridor 703 and the second circuit card corridor 704.

Airflow balance to the top and bottom circuit cards of each of the first circuit card corridor 703 and the second circuit card corridor 704 was established by using additional baffles (601,602,603,604,605,606) placed between the fan modules and the first circuit card corridor 703 and the second circuit card corridor 704. As noted above, in one embodiment these baffles (601,602,603,604,605,606) are integrated into the card guide assembly. Sheet metal carrier plates (1701) were also added to the circuit cards to better control airflow above and below the circuit cards, resulting in improved airflow balance.

Each of these refinements involved interdependencies, which required continual monitoring of, previously solved issues. In some cases previous solutions would have to be revisited and revised (multiple times) in order to maintain overall design goals. With the baseline chassis internal geometry determined, the housing 101 appeared to be tolerant to several different types of processing modules architectures.

Figure 14:
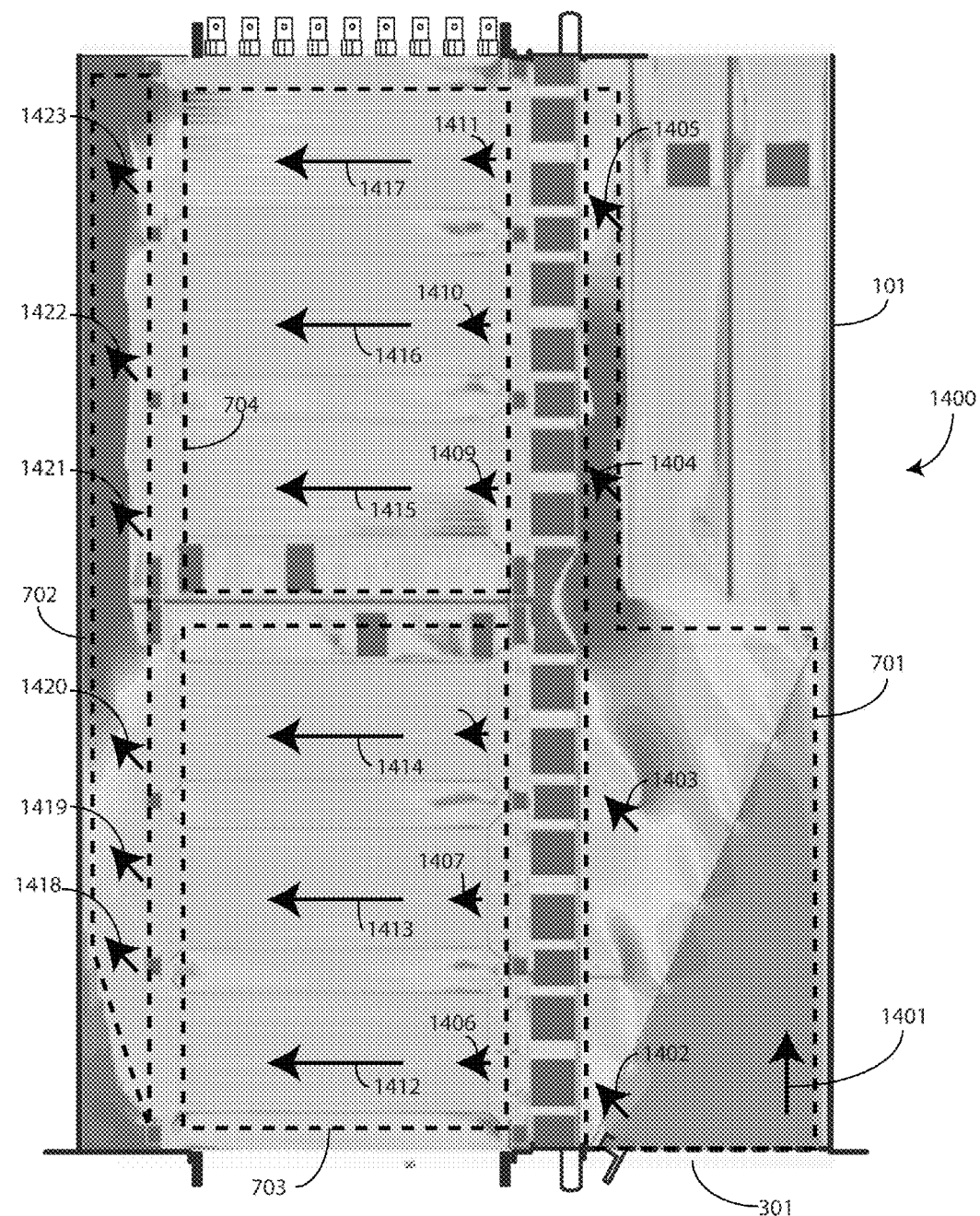
FIG. 14 illustrates cooling occurring in another explanatory electronic device employing another cooling system in accordance with one or more embodiments of the disclosure.

Turning now to FIG. 14, illustrated therein is a thermal analysis demonstrating airflows and cooling of a system 1400 configured as described above with reference to FIGS. 5-8. As shown in the thermal analysis, various temperatures and airflows are shown. These airflows are set forth in the table below.

TABLE 4

| AIR FLOW REFERENC DESIGNATOR | SPEED (METERS PER SECOND) |
| --- | --- |
| 1401 | 9.2 |
| 1402 | 4.5 |
| 1403 | 4.4 |
| 1404 | 9.6 |
| 1405 | 4.1 |
| 1406 | 2.8 |
| 1407 | 2.5 |
| 1408 | 2.1 |
| 1409 | 2.6 |
| 1410 | 2.0 |
| 1411 | 3.9 |
| 1412 | 2.1 |
| 1413 | 2.0 |
| 1414 | 3.8 |
| 1415 | 2.0 |
| 1416 | 2.2 |
| 1417 | 3.8 |
| 1418 | 2.2 |
| 1419 | 2.1 |
| 1420 | 3.0 |
| 1421 | 3.1 |
| 1422 | 3.6 |
| 1423 | 4.2 |

Advantageously, experimental testing demonstrates that about 500 watts of thermal energy can be removed when using 12-volt fan modules in an environment that is at 50 degrees centigrade and 10,000 feet above sea level. It should be noted that these conditions, i.e., 50 degrees centigrade and 10,000 feet above sea level exceed industry standards. When operating in accordance with normal cable headend standards, embodiments of the disclosure are estimated to remove 1000 watts of thermal energy or more.

Alternate designs were constructed as well. Turning now to FIG. 15, illustrated therein is one electronic device 1500 employing an alternate electronics cooling system. As shown in FIG. 15, the electronic device 1500 includes a housing 1501. In this illustrative embodiment, the housing 1501 is configured as a 1RU chassis. The front face 1600 of the housing 1501 is shown in FIG. 16.

As before, a first circuit card 1502 and a second circuit card (disposed beneath the first circuit card 1502) are inserted into the housing 1501 through the front face 1600. Similarly, a third circuit card 1503 and a fourth circuit card (disposed beneath the third circuit card 1503) are inserted into the housing 1501 through the rear face 1504. In the illustrative embodiment of FIGS. 15 and 16, the circuit cards are stacked vertically with each circuit card oriented parallel to the top surface and the bottom surface of the housing 1501.

Fan modules 1505,1506,1507 were then disposed between the circuit card stacks. This configuration was based on a front to back cooling architecture. Testing found that this architecture generally did not address the issues noted above with reference to FIG. 10. Moreover, the thermal performance of these more conventional designs was also less than that offered by the embodiment described above with reference to FIGS. 5-8. Preliminary thermal analysis of the design of FIGS. 15-16 was completed. This confirmed that the cooling efficiency was less than that offered by the embodiment described above with reference to FIGS. 5-8. Based upon research and testing, the embodiment described above with reference to FIGS. 5-8 advantageously fulfilled all required specifications and met all cooling performance goals.

Figure 23:
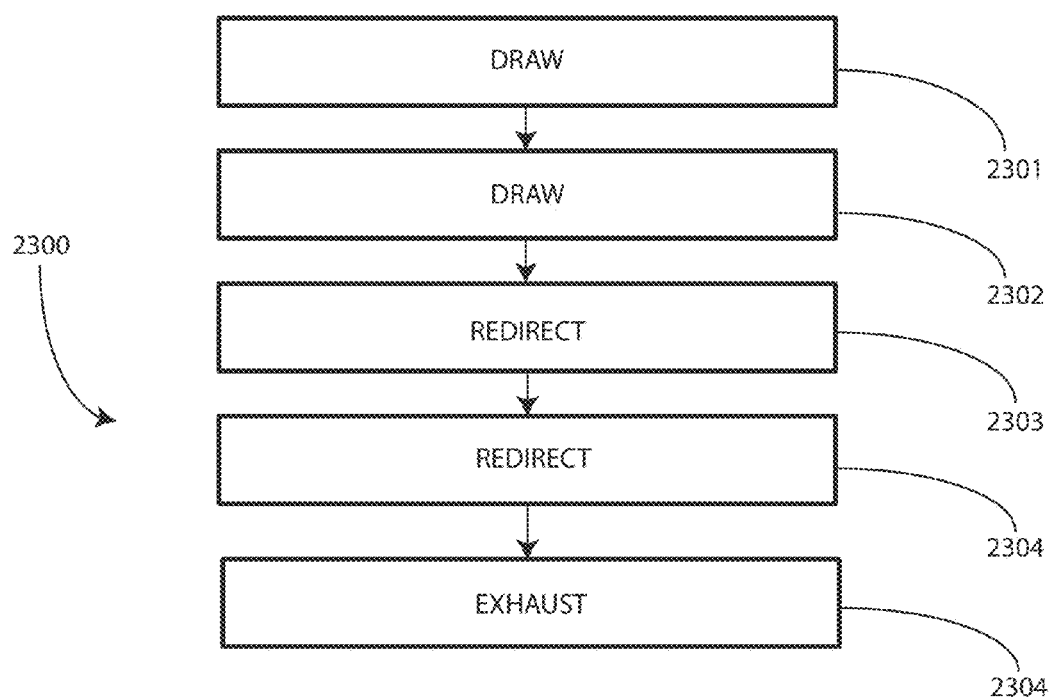
FIG. 23 illustrates one explanatory method in accordance with one or more embodiments of the disclosure.

Turning now to FIG. 23, illustrated therein is one explanatory method 2300 for cooling a chassis in accordance with one or more embodiments of the disclosure. At step 2301, air is drawn into an air inlet of a housing defining a front face, a rear face, a first sidewall, and a second wall. In one embodiment, the air inlet is disposed in the first quadrant.

At step 2302, air is drawn into a first plenum disposed adjacent to the air inlet. At step 2303, the air is redirected to a first circuit card corridor and a second circuit card corridor. In one embodiment, the redirection comprises an orthogonal redirection where the air is turned substantially orthogonally. In one embodiment, the first circuit card corridor and the second circuit card corridor are separated by a barrier wall and disposed between the first plenum and a second plenum. In one embodiment, the redirection is performed by a first fan module extending into the housing from the front face to the barrier wall and disposed between the first plenum and the first circuit card corridor and a second fan module extending into the housing from the rear face to the barrier wall and disposed between the first plenum and the second circuit card corridor.

At step 2304, the air is again redirected into a second plenum. In one embodiment, the redirection comprises an orthogonal redirection where the air is turned substantially orthogonally. At step 2305, the air is exhaust through a rear face that defines an air exhaust in the second quadrant.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronics cooling system, comprising:
    a housing defining a front face, a rear face, a first sidewall, and a second sidewall, the housing defining four quadrants with a first quadrant disposed between the front face and the first sidewall and a second quadrant disposed between the rear face and the second sidewall, the front face defining an air inlet in the first quadrant, the rear face defining an air exhaust in the second quadrant;
    a first plenum disposed adjacent to the air inlet;
    a second plenum disposed adjacent to the air exhaust;
    a first circuit card corridor and a second circuit card corridor, separated by a barrier wall and disposed between the first plenum and the second plenum;

a first fan module extending into the housing from the front face to the barrier wall and disposed between the first plenum and the first circuit card corridor; and a second fan module extending into the housing from the rear face to the barrier wall and disposed between the first plenum and the second circuit card corridor.

2. The electronics cooling system of claim 1, the first circuit card corridor defining a first cooling path to a first side of the barrier wall, the second circuit card corridor defining a second cooling path to a second side of the barrier wall.

3. The electronics cooling system of claim 1, the first fan module and the second fan module each operable to draw air into the housing through the air inlet along a first direction, across the first circuit card corridor and the second circuit card corridor, respectively, in a second direction different from the first direction, and out of the housing through the air exhaust in a third direction different from the second direction.

4. The electronics cooling system of claim 3, the first fan module and the second fan module each comprising hot-swappable fan modules.

5. The electronics cooling system of claim 1, further comprising one or more baffles disposed within the second plenum to direct air from the first fan module and the second fan module to the air exhaust.

6. An electronics cooling system, comprising:
a housing comprising a front face, a rear face, and one or more sidewalls, the housing defining four quadrants arranged in a clockwise order, the front face defining an air inlet in a first quadrant, the rear face defining an air exhaust in a third quadrant;
a first plenum disposed adjacent to the air inlet;
a second plenum disposed adjacent to the air exhaust; and
one or more circuit card corridors disposed between the first plenum and the second plenum;
wherein the first plenum is defined by a volume having an L-shape; and
one or more fan modules disposed between the first plenum and the one or more circuit card corridors, the one or more fan modules operable to draw air in a direction parallel to the front face and the rear face, the one or more fan modules comprising a first fan module having a first plurality of fans coupled to a first carrier and a second fan module having a second plurality of fans coupled to a second carrier.

7. The electronics cooling system of claim 6, the one or more fan modules operable to draw air into the housing through the air inlet along a first direction, across the one or more circuit card corridors in a second direction different from the first direction, and out of the housing through the air exhaust in a third direction different from the second direction.

8. The electronics cooling system of claim 7, the first direction parallel to the third direction.

9. The electronics cooling system of claim 7, the second direction orthogonal to the first direction and the third direction.

10. The electronics cooling system of claim 6, the one or more circuit card corridors comprising a first circuit card corridor and a second circuit card corridor separated by a barrier wall, the first circuit card corridor defining a first cooling path to a first side of the barrier wall, the second circuit card corridor defining a second cooling path to a second side of the barrier wall.

11. The electronics cooling system of claim 10, the first circuit card corridor disposed adjacent to a base portion of the L-shape, the second circuit card corridor disposed adjacent to an upper portion of the L-shape.

12. The electronics cooling system of claim 6, the first carrier selectively removable from the housing through the front face, the second carrier selectively removable from the housing through the rear face.

13. The electronics cooling system of claim 6, further comprising one or more power supplies disposed in a complementary configuration with the L-shape between a base portion of the L-shape and an upper portion of the L-shape.

14. The electronics cooling system of claim 6, further comprising one or more baffles disposed within the second plenum to direct air from the one or more fan modules to the air exhaust.

15. The electronics cooling system of claim 14, the one or more baffles comprising a plurality of baffles disposed along a length of the second plenum, the plurality of baffles oriented at different angles relative to an axis defined by the length of the second plenum.

16. The electronics cooling system of claim 6, further comprising one or more baffles extending distally from the one or more fan modules.

17. An electronics cooling system, comprising: a housing comprising a front face and a rear face, the housing defining four quadrants, the front face defining an air intake in a first quadrant, the rear face defining an air exhaust in a second quadrant 180-degrees out of phase from the first quadrant; a first plenum inside the housing adjacent to the air intake; a second plenum inside the housing adjacent to the air exhaust; one or more circuit card corridors disposed between the first plenum and the second plenum; a first fan module, adjacent to and oriented orthogonally with the front face, and operable to redirect air entering the air intake from a first direction to a second direction; and a second fan module, adjacent to and oriented orthogonally with the rear face, and operable to redirect air entering the air intake from the first direction to the second direction, the first fan module having a first plurality of fans coupled to a first carrier and the second fan module having a second plurality of fans coupled to a second carrier.

18. The electronics cooling system of claim 17, the first fan module and the second fan module each comprising hot-swappable fan modules, the second direction substantially orthogonal with the first direction.

* * * * *